(12) United States Patent  
Yoshizumi

(10) Patent No.: US 7,829,473 B2  
(45) Date of Patent: Nov. 9, 2010

(54) METHOD FOR MANUFACTURING MEMORY ELEMENT

(75) Inventor: Kensuke Yoshizumi, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 416 days.

(21) Appl. No.: 12/050,687

(22) Filed: Mar. 18, 2008

(65) Prior Publication Data

US 2008/0242083 A1 Oct. 2, 2008

(30) Foreign Application Priority Data

Mar. 26, 2007 (JP) .............................. 2007-078348

(51) Int. Cl.
H01L 21/469 (2006.01)
(52) U.S. Cl. .................. 438/758; 438/660; 427/117; 427/58; 257/737; 257/E23.023; 257/E21.476; 257/40; 257/632
(58) Field of Classification Search .......... 438/660, 438/758; 427/117, 58; 257/737, E23.023, 257/E21.476, 40, 632, 296
See application file for complete search history.

(56) References Cited

U.S. PATENT DOCUMENTS

| | | | |
|---|---|---|---|
| 5,583,819 A | 12/1996 | Roesner et al. | |
| 6,051,851 A | 4/2000 | Ohmi et al. | |
| 6,534,841 B1 | 3/2003 | Van Brocklin et al. | |
| 6,584,029 B2 | 6/2003 | Tran et al. | |
| 6,972,046 B2 * | 12/2005 | Sun et al. ....................... | 75/348 |
| 7,189,438 B2 * | 3/2007 | Momose et al. ............. | 427/598 |
| 7,449,237 B2 * | 11/2008 | Chan et al. ................... | 428/403 |
| 2003/0039860 A1 * | 2/2003 | Cheon et al. ............. | 428/694 T |
| 2004/0092125 A1 * | 5/2004 | Kim et al. ................... | 438/722 |
| 2004/0263564 A1 | 12/2004 | Maekawa et al. | |
| 2005/0095356 A1 | 5/2005 | Nakamura et al. | |
| 2005/0189520 A1 | 9/2005 | Okada et al. | |

(Continued)

FOREIGN PATENT DOCUMENTS

EP   1571186   9/2005

(Continued)

OTHER PUBLICATIONS

Shimoda.T, "39.1:Invited Paper:Ink-Jet Technology for Fabrication Processes of Flat Panel Displays,", SID Digest '03 : SID International Symposium Digest of Technical Papers, 2003, pp. 1178-1181.

*Primary Examiner*—Fernando L Toledo
*Assistant Examiner*—Ankush K Singal
(74) *Attorney, Agent, or Firm*—Husch Blackwell LLP Welsh Katz

(57) ABSTRACT

A first conductive layer is formed, a composition layer over the first conductive layer is formed by discharging a composition in which nanoparticles comprising a conductive material covered with an organic material are dispersed in a solvent, and the composition layer is dried. Subsequently, pretreatment is performed in which the organic material covering the nanoparticles, which are positioned on a surface of the composition layer, is decomposed, and then baking is performed. In this manner, a second conductive layer is formed by sintering nanoparticles which are positioned on a surface of the composition layer. A memory layer is formed between the first conductive layer and the second conductive layer using the nanoparticles covered with the organic materials to which the pretreatment is not performed.

31 Claims, 19 Drawing Sheets

U.S. PATENT DOCUMENTS

| | | | |
|---|---|---|---|
| 2005/0274943 A1* | 12/2005 | Chen ............................ | 257/40 |
| 2006/0028895 A1 | 2/2006 | Taussig et al. | |
| 2006/0046336 A1 | 3/2006 | Shoji et al. | |
| 2006/0057355 A1* | 3/2006 | Suzuki et al. ............ | 428/308.4 |
| 2006/0073337 A1* | 4/2006 | Nauka et al. ................ | 428/407 |
| 2006/0158482 A1 | 7/2006 | Nakamura et al. | |
| 2006/0208230 A1* | 9/2006 | Cho et al. .................... | 252/500 |
| 2006/0208248 A1* | 9/2006 | Lee et al. ...................... | 257/3 |
| 2006/0210815 A1 | 9/2006 | Furusawa et al. | |
| 2006/0234418 A1* | 10/2006 | Ufert ........................... | 438/99 |
| 2006/0249769 A1* | 11/2006 | Eder et al. ................. | 257/296 |
| 2007/0051952 A1 | 3/2007 | Yamazaki et al. | |
| 2007/0051958 A1 | 3/2007 | Yamazaki et al. | |
| 2007/0064175 A1* | 3/2007 | Kim et al. ..................... | 349/86 |
| 2007/0160837 A1* | 7/2007 | Chikamori et al. .......... | 428/403 |
| 2008/0020483 A1* | 1/2008 | Nishigaki et al. ........... | 436/172 |
| 2008/0102201 A1* | 5/2008 | Choi et al. ................... | 427/241 |
| 2008/0220155 A1* | 9/2008 | Yoshizumi et al. .......... | 427/117 |
| 2008/0268229 A1* | 10/2008 | Lee et al. ..................... | 428/323 |
| 2009/0039507 A1* | 2/2009 | Funaki ....................... | 257/737 |

FOREIGN PATENT DOCUMENTS

| | | |
|---|---|---|
| JP | 2001-015472 | 1/2001 |
| JP | 2001-237380 | 8/2001 |
| JP | 2002-026277 | 1/2002 |
| JP | 2005-116682 | 4/2005 |
| JP | 2005-247905 | 9/2005 |
| JP | 2006-291347 | 10/2006 |

* cited by examiner

METHOD FOR MANUFACTURING MEMORY ELEMENT

BACKGROUND OF THE INVENTION

1. Field of the Invention

The present invention relates to a memory element and a semiconductor device having the memory element.

2. Description of the Related Art

In recent years, a semiconductor device having various functions, in which a plurality of circuits is integrated over an insulating surface, has been developed. In addition, a semiconductor device capable of transmitting and receiving of data, which is provided with an antenna and operates with electrical energy into which electric wave received by the antenna has been converted, has been developed. Such a semiconductor device is referred to as a wireless chip (also referred to as an ID tag, an IC tag, an IC chip, an RF (radio frequency) tag, a wireless tag, an electronic tag, or an RFID (radio frequency identification)), and has already been introduced into some markets.

Most of these semiconductor devices that have already been put into practical use have an antenna and a circuit (also referred to as an IC (integrated circuit) chip) using a semiconductor substrate such as a silicon substrate. The IC chip includes a memory circuit (also referred to as a memory), a control circuit, and the like. In particular, it is possible to provide a semiconductor device with higher performance and high added value by being provided with a memory circuit which can store much data. However, despite that silicon substrates are expensive, these semiconductor devices are required to be manufactured at low cost. This is because small semiconductor devices such as a wireless chip are expected to be in demand as semi-disposable products. As a result, in recent years, an organic thin film transistor (hereinafter, also referred to as an "organic TFT"), an organic memory, and the like using organic compounds for a control circuit, a memory circuit, and the like have been actively developed (for example, see Patent Document 1: Japanese Published Patent Application No. 2002-26277).

A memory element that functions as a memory portion of an organic memory is formed by providing an organic compound layer between a pair of electrodes, and data are written to the memory element utilizing change in an electrical characteristic such as a resistance value which is caused by application of voltages. Such an organic compound layer is generally formed by an evaporation method.

When an organic compound layer is formed by an evaporation method, only part of the vaporized organic compound is used, which leads to low efficiency in the use of materials. There is also a problem in that for example since materials which are not used are also vaporized, a large amount of energy is consumed in a manufacturing process.

In addition, when an organic memory is manufactured by an evaporation method using a metal mask, an alignment step for aligning the metal mask is required. Therefore, manufacturing yield is reduced due to bad alignment.

SUMMARY OF THE INVENTION

Accordingly, it is an object of the present invention to provide a memory element which can be manufactured simply with high yield at low cost. Further, it is another object of the present invention to provide a semiconductor device having the memory element.

In the present invention, a memory element has a structure including at least a first conductive layer, a second conductive layer, and a memory layer interposed between the first conductive layer and the second conductive layer. The memory layer and the second conductive layer are manufactured by the following method. A composition in which nanoparticles including a conductive material covered with an organic material are dispersed in a solvent is discharged over the first conductive layer by a coating method such as a droplet discharging method, and then the solvent is vaporized by drying. Then, pretreatment is performed to a discharged substance which remains over the first conductive layer, that is, the nanoparticles covered with the organic material, whereby a sintering temperature of the nanoparticles which are positioned on a surface is reduced. After that, the second conductive layer is formed by baking and sintering only nanoparticles of which sintering temperature is reduced. Note that nanoparticles in the discharged substance which are not sintered are used as a memory layer.

As described above, the pretreatment is performed, whereby the memory layer and the second conductive layer can be formed using the same discharge substance in the same process. Accordingly, since the manufacturing process can be simplified, and further, the use efficiency of the materials can be improved, a memory element can be manufactured with high yield at low cost.

Note that the organic material covering the nanoparticles which are positioned on a surface are decomposed in the pretreatment described above. The pretreatment can be performed using, for example, active oxygen and by plasma treatment as well.

Active oxygen can be generated, for example, by irradiating with an ultraviolet ray in an ozone atmosphere. Note that ozone may be supplied directly, and for example, ozone can be generated by irradiating oxygen with the ultraviolet ray with a wavelength of less than or equal to 240 nm.

When oxygen is irradiated with the ultraviolet ray with a wavelength of less than or equal to 175 nm, active oxygen can be generated from oxygen in addition to ozone. Therefore, when the ultraviolet ray with a wavelength of less than or equal to 175 nm are used, active oxygen can be obtained more effectively. Accordingly, a baking temperature can be reduced by the short-time pretreatment.

One feature of the present invention is a method for manufacturing a memory element including the steps of forming a first conductive layer; forming a composition layer over the first conductive layer by discharging a composition in which nanoparticles including a conductive material covered with an organic material are dispersed in a solvent; drying the composition layer; performing pretreatment by exposing a surface of the composition layer in which the solvent is vaporized by drying to active oxygen, and then forming a memory layer and a second conductive layer using the composition layer by baking, in which the memory layer includes nanoparticles covered with the organic material which is included in the composition; and in which the second conductive layer is formed by sintering nanoparticles included in the composition.

Another feature of the present invention is a method for manufacturing a memory element including the steps of forming a first conductive layer; forming a composition layer over the first conductive layer by discharging a composition in which nanoparticles including a conductive material covered with an organic material are dispersed in a solvent; irradiating the composition layer in which the solvent is vaporized by drying with an ultraviolet ray in an ozone atmosphere, and then forming a memory layer and a second conductive layer using the composition layer by baking, in which the memory layer includes nanoparticles covered with the organic material which is included in the composition; and in which the second conductive layer is formed by sintering nanoparticles included in the composition.

Another feature of the present invention is a method for manufacturing a memory element including the steps of forming a first conductive layer; forming a composition layer over the first conductive layer by discharging a composition in which nanoparticles including a conductive material covered with an organic material are dispersed in a solvent; irradiating the composition layer in which the solvent is vaporized by drying with an ultraviolet ray with a wavelength of less than or equal to 240 nm in air, and then forming a memory layer and a second conductive layer using the composition layer by baking, in which the memory layer includes nanoparticles covered with the organic material which are included in the composition; and in which the second conductive layer is formed by sintering nanoparticles included in the composition.

Another feature of the present invention is a method for manufacturing a memory element including the steps of forming a first conductive layer; forming a composition layer over the first conductive layer by discharging a composition in which nanoparticles including a conductive material covered with an organic material are dispersed in a solvent over the first conductive layer; irradiating the composition layer in which the solvent is vaporized by drying with an ultraviolet ray with a wavelength of less than or equal to 175 nm in air, and then forming a memory layer and a second conductive layer using the composition layer by baking, in which the memory layer includes nanoparticles covered with the organic material which are included in the composition; and in which the second conductive layer is formed by sintering nanoparticles included in the composition.

By application of voltage to such a memory element, an electrical characteristic of the memory layer is changed, whereby data are written to the memory element. For example, a resistance value may be given as an example of electrical characteristics, and writing is performed utilizing change in the resistance value caused by the electrical connection between parts of the first conductive layer and the second conductive layer of the memory element, that is, short circuit (also referred to as "short").

Another feature of the present invention may be a semiconductor device in which a plurality of the above memory elements are arranged in matrix. Each of the plurality of memory elements may also be connected to a thin film transistor.

In this specification, the first conductive layer and the second conductive layer are referred to as electrodes as well.

According to the present invention, a memory element and a semiconductor device equipped with the memory element, which excel in performance and reliability, can be simply manufactured with high yield. Accordingly, a memory element and a semiconductor device which excel in performance and reliability can be provided at low cost.

DETAILED DESCRIPTION OF THE INVENTION

Figure 1:
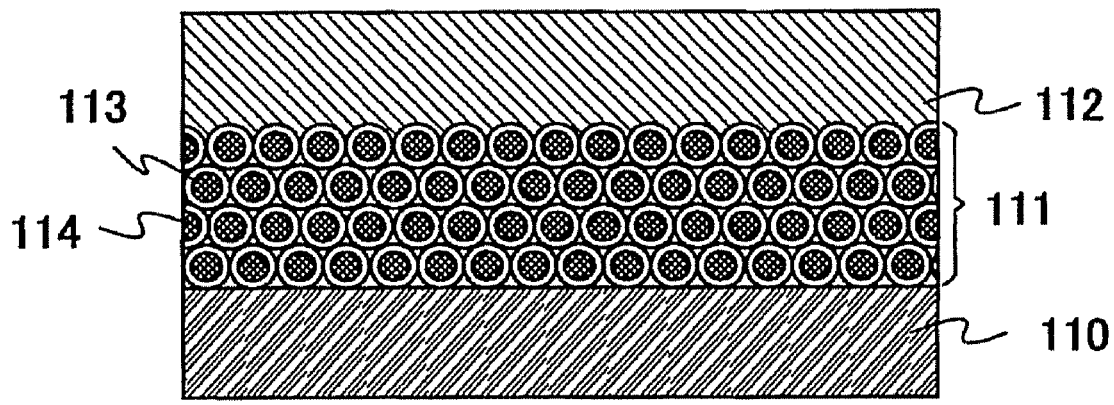
FIG. 1 is a view describing a structural example of a memory element of the present invention.

Embodiment modes of the present invention will be described hereinafter with reference to the drawings. Note that the present invention is not limited to the description below, and it is easily understood by those skilled in the art that various changes and modifications can be made without departing from the spirit and scope of the present invention. Accordingly, the present invention should not be construed as being limited to the content of the embodiment modes below. Note that in structures of the present invention to be described below, there are cases where like reference numerals denoting like portions in different drawings are used in common.

Embodiment Mode 1

A structural example of a memory element of the present invention will be described with reference to FIG. 1. The memory element illustrated in FIG. 1 includes a first conductive layer 110, a second conductive layer 112 and a memory layer 111 interposed between the first conductive layer 110 and the second conductive layer 112. The memory layer 111 is formed of nanoparticles 114 formed of conductive materials which are covered with organic materials 113. Accordingly, the second conductive layer 112 is provided over the first conductive layer 110 with a region where an insulating film which is formed of the organic materials 113 and the nanoparticles 114 formed of conductive materials are alternately arranged interposed therebetween. That is, the first conductive layer 110 and the second conductive layer 112 are provided with a plurality of the insulating film which is formed of the organic materials 113 and a plurality of the conductive layers of the nanoparticles 114 formed of conductive materials alternately interposed therebetween.

Figure 2A:
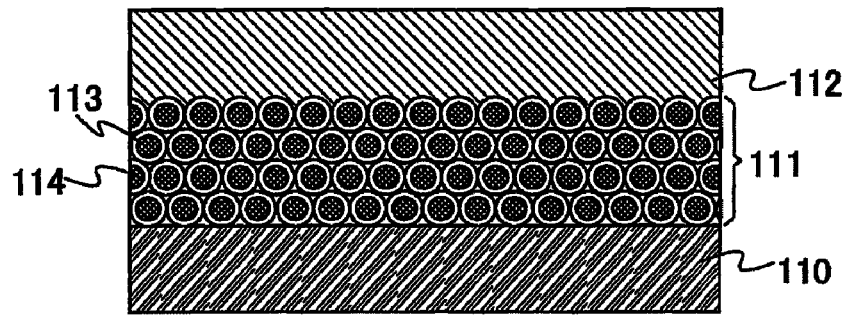
FIGS. 2A to 2C are views describing an operation mechanism of the memory element of the present invention.
Figure 2B:
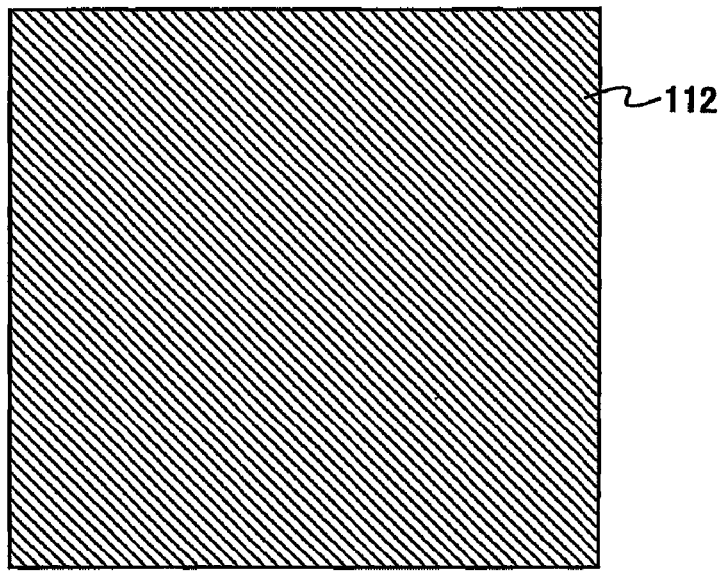
Figure 2C:
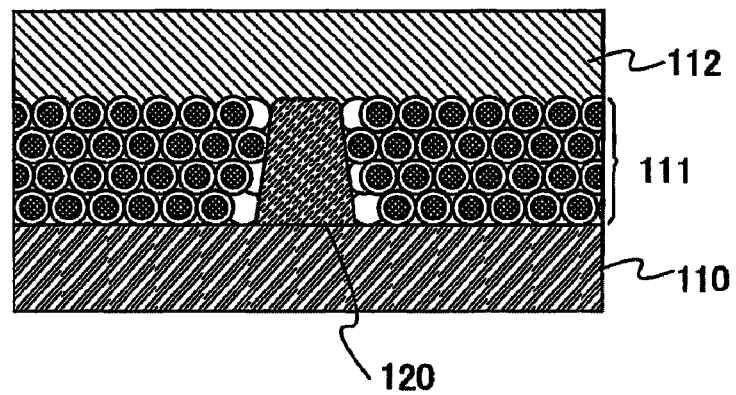

First, an operation mechanism of a memory element of the present invention will be described with reference to FIGS. 2A to 2C. FIG. 2A is a cross sectional view of the memory element before writing. FIGS. 2B and 2C are a top view and a cross sectional view of the memory element after writing, respectively. The memory layer 111 before application of voltage, that is, before writing is formed of nanoparticles 114 formed of conductive materials which are covered with the organic materials 113. Accordingly, the memory layer 111 has no conductivity, so that a resistance value of the memory element is high. When voltage is applied between the first conductive layer 110 and the second conductive layer 112 of such a memory element, a small amount of current flows through the memory layer 111, so that Joule heat is generated. The Joule heat breaks the organic materials 113, and nanoparticles formed of conductive materials contact and weld with each other. Consequently, the resistance value of the memory layer 111 is lowered, and as illustrated in FIG. 2C, the first conductive layer 110 and the second conductive layer 112 are electrically connected through a conductive portion 120 formed by welding, so that the memory element is eventually short-circuited. As described above, the resistance value of the memory element changes before and after voltage is applied.

Writing data is performed using change in the resistance of the memory element by application of voltage utilizing the above-described operation mechanism.

The conductive portion 120 formed in the memory layer 111 of the memory element to which data has been written becomes columnar, subulate, or spherical in shape. The shape of the conductive portion 120 is not limited to the shapes described above, and the shape thereof may be any as long as the conductive portion 120 has a function of electrically connecting the first conductive layer 110 and the second conductive layer 112. Further, the cross-sectional shape of the conductive portion is not always to be bilaterally symmetrical because the conductive portion 120 is formed by welding of nanoparticles formed of conductive materials. A cavity may be generated in the vicinity of the conductive portion 120 depending on the circumstances. Note that at least one conductive portion 120 is formed in the memory layer 111, and an area thereof is not particularly limited.

Next, a method for manufacturing a memory element of the present invention and a material which can be used for each layer will be described with reference to FIGS. 3A to 3C.

Figure 3A:
FIGS. 3A to 3C are views describing a manufacturing method of the memory element of the present invention.
Figure 3B:
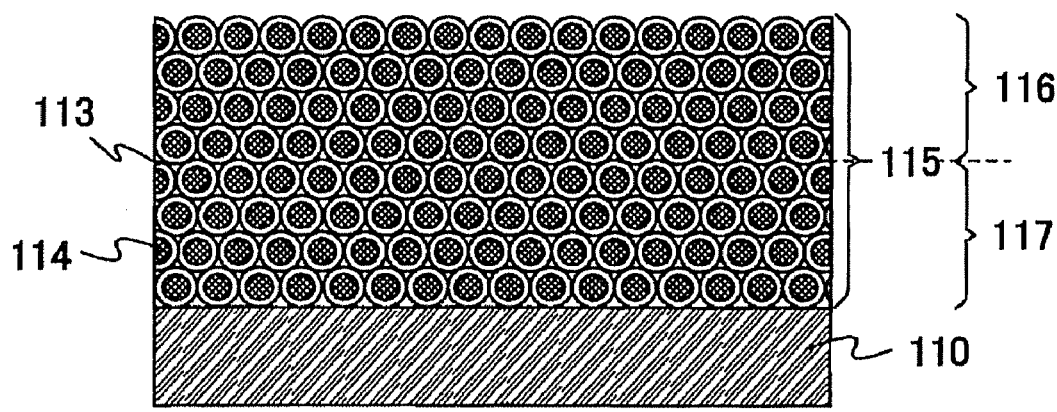

First, as illustrated in FIG. 3A, the first conductive layer 110 is formed using a single layer structure or a stacked layer structure of metal, alloy, a compound, or the like which are highly conductive.

For example, a metal such as gold (Au), silver (Ag), platinum (Pt), nickel (Ni), tungsten (W), chromium (Cr), molybdenum (Mo), iron (Fe), cobalt (Co), copper (Cu), palladium (Pd), aluminum (Al), manganese (Mn), titanium (Ti), tantalum (Ta); a nitride of a metal material (for example, titanium nitride, tungsten nitride, or molybdenum nitride); besides a metal belonging to Group 1 or 2 of the periodic table, that is, an alkali metal such as lithium (Li) or cesium (Cs), an alkaline earth metal such as magnesium (Mg), calcium (Ca), or strontium (Sr); an alloy containing any of them (for example, Mg:Ag and Al:Li); or the like can be used. Further, a rare earth metal such as europium (Er), or ytterbium (Yb) or an alloy including them; or the like may be used. Alternatively, indium tin oxide used as a transparent conductive film (hereinafter, referred to as ITO), indium tin oxide containing silicon, indium oxide (abbrev.: IZO) containing 2 to 20 wt % of zinc oxide (ZnO) or the like can be used.

Note that the first conductive layer 110 can be formed by an evaporation method, a sputtering method, a CVD method, a printing method, an electrolytic plating method, an electroless plating method, a spin coating method, or the like.

Next, the memory layer 111 and the second conductive layer 112 are formed over the first conductive layer 110 in the same process.

First, a composition in which nanoparticles formed of conductive materials are dispersed is discharged over the first conductive layer 110 by a coating method such as a droplet discharging method. A droplet discharging method is a method for forming a pattern by discharging a droplet containing a predetermined substance from a pore. Here, a composition, in which nanoparticles formed of conductive materials are dispersed in a solvent, is discharged (jetted). Note that a composition to be discharged is also referred to as a discharged material.

For a conductive material to form nanoparticles, a metal element selected from gold (Au), silver (Ag), platinum (Pt), nickel (Ni), copper (Cu), palladium (Pd), tantalum (Ta), iridium (Ir), rhodium (Rh), tungsten (W), aluminum (Al), iron (Fe), zinc (Zn), tin (Sn), titanium (Ti), indium (In), zirconium (Zr), barium (Ba), or the like or an alloy material containing such an element as a main component is used. Further, a metal sulfide of cadmium (Cd) or zinc (Zn), oxide of germanium (Ge), silicon (Si), the above-described metal elements, or the like, one or more halides may be mixed. Further, the above-described metal elements and compounds may be mixed. In addition, ITO which is used as a transparent conductive film, indium tin oxide containing silicon, IZO, or the like can be used for a conductive material.

In the case where two or more kinds of elements or compounds are used for conductive materials, the mixed state is not limited in particular, for example, each of them may also be uniform, or any one of them may also be concentrated in the core portion.

The grain diameter of a nanoparticle is greater than or equal to 1 nm and less than or equal to 200 nm, preferably greater than or equal to 1 nm and less than or equal to 100 nm, and grain diameters of the nanoparticles included in the discharged material are preferably uniform.

The nanoparticles may be formed by any of a gas phase method, a liquid phase method, or a solid phase method, and a manufacturing method thereof is not particularly limited.

For the solvent, water or an organic solvent can be used, and an organic solvent may be either a water-soluble organic solvent or a water-insoluble organic solvent. For example, as a water-soluble organic solvent, alcohols such as methanol, ethanol, propanol, butyl alcohol, glycerin, dipropylene glycol, or ethylene glycol, ketones such as acetone or methyl ethyl ketone, glycol ethers such as ethylene glycol monomethyl ether, ethylene glycol monoethyl ether, ethylene glycol monobutyl ether, or diethylene glycol monobutyl ether, a water-soluble nitrogen containing an organic compound such as 2-pyrrolidone or N-methylpyrrolidone, ethyl acetate, or the like can be given. Further, as a water-insoluble organic solvent, alkanes such as octane, nonan, or decane, aromatics such as cycloalkane, toluene, xylene, benzene, or dichlorobenzene, or the like can be given. Naturally, not only one solvent is necessarily used but a mixture of a plurality of solvents may be used as long as phase separation does not occur between the solvents.

Note that a nanoparticle exist in a state where it is covered with the organic material to prevent a nanoparticle from aggregating in the solvent of the discharged material. The organic material correspond to a dispersant having a function of stably dispersing the particles. The organic material is formed of a surfactant, a substance which can form a coordinate bond with a metal element contained in the conductive material, or the like. Here, as a substance forming a coordinate bond with the metal element, a substance having a lone electron-pair on an atom of nitrogen, sulfur, oxygen, or the like such as an amino group, a thiol group (—SH), a sulfanediyl group (—S—), a hydroxy group (—OH), an oxy group (—O—), a carboxyl group (—COOH), a cyano group (—CN), or the like can be used. For example, hydroxyamines such as ethanolamine, an amine-based compound such as (oleylamine, polyethyleneimine or polyvinylpyrrolidone, alcohols such as polyvinyl alcohol, alkanethiols, dithiols, glycols such as ethylene glycol, diethylene glycol, or polyethylene glycol, polyacrylic acid, carboxymethylcellulose, or the like can be used. Further, as a surfactant, for example, an anionic surfactant such as bis(2-ethylhexyl)sulfosuccinic acid or sodium dodecylbenzenesulfonate, a nonionic surfactant such as alkyl ester which is polyalkyl glycol or alkyl phenyl ether, a fluorosurfactant, a copolymer having polyethyleneimine and polyethylene oxide, or the like can be used.

Accordingly, nanoparticles formed of conductive materials, which are covered with the organic materials, are dispersed in the solvent and discharged. Note that the discharged material may contain a substance used for forming the nanoparticles, a binder, a plasticizer, a silane coupling agent, or the like besides a conductive material, a dispersant, and a solvent. As a binder, a thermosetting resin, for example, an organic resin such as polyimide, acrylic, a novolac resin, a melamine resin, a phenol resin, an epoxy resin, a silicone resin, a furan resin, or a diallyl phthalate resin can be used. Note that a binder can suppress spots which are nonuniformly sintered between nanoparticles in a later baking step by force of contraction of a thermosetting resin. Further, such a resin makes it also possible to adjust the viscosity of the discharged material.

Figure 4:
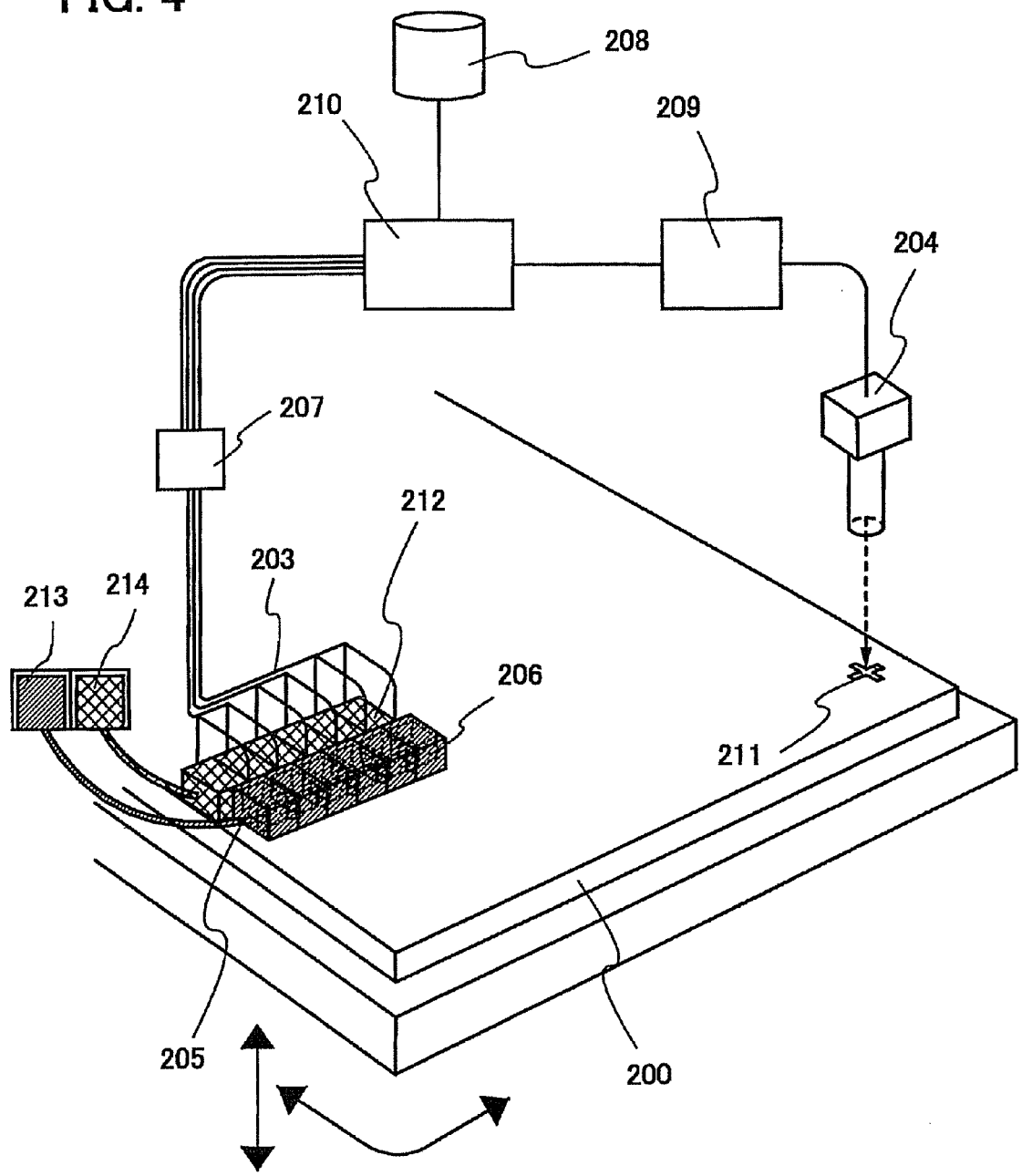
FIG. 4 is a view illustrating one mode of a droplet discharging device

One mode of a droplet discharging apparatus used in a droplet discharging method is illustrated in FIG. 4. Each of heads 205 and 212 of a droplet discharging unit 203 is connected to a controller 207, and this controller 207 is controlled by a computer 210, so that a preprogrammed pattern can be drawn. The drawing position may be determined, for example, using a marker 211 that is formed over a substrate 200 provided with the memory element as the reference. Alternatively, the edge of the substrate 200 may be used as the reference. The reference is detected by an imaging unit 204, and converted into a digital signal by an image processing unit 209. Then, the digital signal is recognized by the computer 210 and a control signal is generated and is transmitted to the controller 207. An image sensor or the like using a charge coupled device (CCD) or a complementary metal oxide semiconductor can be used as the imaging unit 204. Information about a pattern to be formed over the substrate 200 is stored in a storage medium 208, and the control signal is transmitted to the controller 207 based on the information, so that each of the heads 205 and 212 of the droplet discharging unit 203 is individually controlled. The heads 205 and 212 are supplied with the discharged material, from material supply sources 213 and 214 respectively through pipes.

The head 205 has an internal structure in which spaces filled with liquid materials as indicated by dotted lines 206 and nozzles which are discharging outlets are provided. Although not illustrated in the figure here, the head 212 also has an internal structure similar to that of the head 205. When the heads 205 and 212 have different nozzle sizes, different materials can be discharged so as to have different widths simultaneously. Naturally, the same material can be discharged so as to have different widths simultaneously.

In using a large substrate, the heads 205 and 212 can be freely scanned in directions indicated by the arrows in the figure, and a drawing region can be freely set. Therefore, a plurality of the same patterns can be drawn on one substrate. Further, a drawing region may be freely set by moving a stage. Naturally, the heads and the stage may be moved simultaneously.

Note that the viscosity of a discharged material is preferably less than or equal to 20 mPa·s so that the discharged material can be discharged from the nozzles smoothly. The surface tension of the discharged material is preferably less than or equal to 40 mN/m. Note that, the viscosity of the discharged material, or the like may be adjusted as appropriate in accordance with the solvent which is used, usage, or the like. For example, the viscosity of a discharged material in which nanoparticles of gold or silver are dispersed in a solvent may be set so as to be greater than or equal to 5 mPa·s and less than or equal to 20 mPa·s.

The discharged material in which nanoparticles formed of conductive materials are dispersed is discharged in a desired position by a droplet discharging apparatus as described above, and then the solvent is vaporized by drying. Note that, since the discharged material can be discharged in a desired position, use efficiency of the material can be improved. FIG. 3B is a schematic view illustrating the discharged material after drying. As illustrated in FIG. 3B, substances except the solvent, that is, nanoparticles 114 formed of conductive materials and organic materials 113 covering the nanoparticles 114 remain over the first conductive layer 110. These substances remaining over the first conductive layer 110, that is, the discharged materials after drying is also referred to as a discharged substance 115. The memory layer 111 and the second conductive layer 112 are formed using the discharge substance 115. Drying conditions are different depending on a solvent which is used. For example, when propanol is used as a solvent, drying may be performed at 100 C.° for approximately 5 minutes. Note that time which is needed for drying may be shortened by heating the substrate provided with the first conductive layer 110 in discharging the material. The solvent may remain in the organic materials 113 in some cases. Further, as described above, the discharged material contains a substance used for forming the nanoparticles (e.g. a reducing agent), a binder, a plasticizer, a silane coupling agent, or the like, in some cases. Therefore, these substances are contained in the organic materials 113 depending on a discharged material in some cases.

Here, the discharged material is discharged in a desired position over the first conductive layer 110 by a droplet discharging method; however, the present invention is not limited thereto. For example, increasing the viscosity of the discharged material makes it possible to utilize a printing method such as a screen printing method.

Next, as pretreatment of a subsequent baking step of forming the memory layer 111 and the second conductive layer 112, the discharge substance 115 is exposed to active oxygen, thereby decomposing the organic materials 113. Note that the organic materials 113 with respect to all the nanoparticles 114 contained in the discharge substance 115 are not decomposed. A portion which is exposed to active oxygen, that is, the organic materials 113 covering nanoparticles 114 which are positioned on a surface of the discharged substance, are sequentially decomposed. In this manner, a pretreatment is performed to the discharge substance 115, whereby a layer formed of the discharge substance 115 can be divided into a layer 116 having the discharge substance to which pretreatment is performed and a layer 117 having the discharge substance to which pretreatment is not performed. Accordingly, since the organic materials 113 contained in the layer 116 to which pretreatment is performed are decomposed, sintering of nanoparticles 114 contained in the layer 116 can occur at a lower baking temperature than that of nanoparticles 114 contained in the layer 117 to which pretreatment is not performed.

Figure 3C:
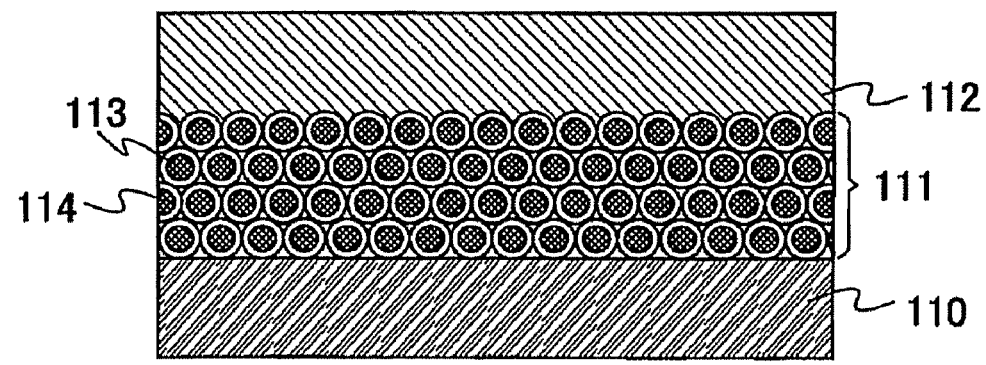

Next, by utilizing the above, baking is performed at a temperature where sintering can occur in only nanoparticles 114 contained in the layer 116 to which pretreatment is performed, whereby resistance of the layer 116 is lowered and the second conductive layer 112 is formed as illustrated in FIG. 3C. Sintering does not occur in nanoparticles 114 contained in the layer 117 to which pretreatment is not performed. The layer 117 containing nanoparticles which are not sintered is used as the memory layer 111 in the memory element of the present invention. The thickness of the discharge substance 115 and pretreatment conditions may be set as appropriate in consideration for the thicknesses of the memory layer 111 and the second conductive layer 112. In this manner, the memory layer 111 and the second conductive layer 112 can be formed from the same discharge substance 115.

In this manner, since the memory layer 111 and the second conductive layer 112 can be formed simultaneously, a manufacturing process can be simplified and the memory element can be manufactured with high yield at a low cost.

Note that a void may be generated in the second conductive layer 112, depending on conductive materials contained in nanoparticles. This is because crystal growth of the conductive material is progressed very rapidly. Generation of such a void can be suppressed by using an alloy material for nanoparticles.

In the memory layer 111, the state change is hardly generated as compared to the layer 117 before baking, and the memory layer 111 contains nanoparticles 114 formed of conductive materials which are covered with organic materials 113. Although a part of the organic materials 113 covering the nanoparticles 114 is decomposed in some cases, depending on the baking conditions, it does not particularly matter if the resistance value in the memory layer 111 after being manufactured, that is, before writing is higher than that after writing.

Note that active oxygen used in the pretreatment can be obtained, for example, by the following method. As shown in the formula (1), active oxygen $O(^1D)$ can be generated by irradiating ozone with an ultraviolet ray. Note that, in the formula (1), h represents Planck constant, "ν" represents a frequency of the ultraviolet ray, and irradiation of the ultraviolet ray may be performed using an ultraviolet irradiation device such as an ultraviolet lamp or a laser. Since ozone has a strong absorption band in ultraviolet region of greater than or equal to 200 nm and less than or equal to 300 nm, a lamp, a laser, or the like which emits the ultraviolet ray in this wavelength region efficiently is preferably used as an ultraviolet irradiation device.

$$O_3 + h\nu \rightarrow O_2 + O(^1D) \quad (1)$$

The pretreatment using active oxygen may be performed by supplying active oxygen which is separately generated, or by irradiating the discharged substance with the ultraviolet ray from the above in an ozone atmosphere, for example. The above methods are different in whether the discharged substance 115 is irradiated with the ultraviolet ray or not. The former method is especially effective when an element, or the like which should not be irradiated with the ultraviolet ray is provided in the bottom layer of the memory element, or the like. Meanwhile, when the latter method is used, since the ultraviolet ray have high energy, bonds of the organic materials 113 can be cut. Therefore, oxidation is promoted by active oxygen and decomposition of the organic materials 113 in the pretreatment proceeds easily, so that a baking temperature of the layer 116 can be reduced by the short-time pretreatment. In this case, a low-pressure mercury vapor lamp or an excimer lamp is preferably used as an ultraviolet irradiation device. A low-pressure mercury vapor lamp can emit light with wavelengths of 185 nm and 254 nm. An excimer lamp is a lamp utilizing light emission of excimer and can make a central wavelength different, in accordance with discharging gas which is used. As discharging gas, a rare gas or a mixed gas of a rare gas and a halogen gas can mainly be used. Specifically, an excimer lamp which uses xenon as discharging gas and has a luminescence center in a wavelength of 172 nm is preferably used. Energy of light with a wavelength of 185 nm which is emitted from a low-pressure mercury vapor lamp and light with a wavelength of 172 nm which is emitted from an excimer lamp using xenon is larger than various binding energy included in the organic materials in many cases. Accordingly, they are preferably used as an ultraviolet irradiation device.

Note that ozone may be generated by using oxygen or by an ozone generating device using corona discharge, or the like. A method thereof will be described below. Oxygen contained in the air may be used and oxygen may also be supplied.

When irradiation with the ultraviolet ray with a wavelength of less than or equal to 240 nm is performed in the presence of oxygen, ozone can be obtained from oxygen as shown in the formulae (2) and (3). Note that $O(^3P)$ represents atomic oxygen in a ground state.

$$O_2 + h\nu \rightarrow O(^3P) + O(^3P) \quad (2)$$

$$O_2 + O(^3P) \rightarrow O_3 \quad (3)$$

When irradiation with light with a wavelength of less than or equal to 175 nm is performed in the presence of oxygen, active oxygen can also be obtained from oxygen as shown in the formula (4). Accordingly, when an ultraviolet irradiation device which emits light with such a wavelength is used, active oxygen can be obtained with high efficiency; therefore, a baking temperature of the layer 116 can be reduced by the short-time pretreatment. Note that atomic oxygen $O(^3P)$ obtained here is used for generation of ozone (see the formula (3)).

$$O_2 + h\nu \rightarrow O(^1D) + O(^3P) \quad (4)$$

For example, when a low-pressure mercury vapor lamp is used as an ultraviolet irradiation device, as shown in the formulae (1), (2) and (3), active oxygen is generated using light with a wavelength of 254 nm from ozone obtained by irradiation with the ultraviolet ray with a wavelength of 185 nm. The organic materials 113 are decomposed using active oxygen thus obtained. Naturally, as described above, when the discharge substance is irradiated with the ultraviolet ray obtained from a low-pressure mercury vapor lamp, bonds of the organic materials 113 are easily cut in particular by irradiation with the ultraviolet ray with a wavelength of 185 nm. Therefore, oxidation is promoted by active oxygen and decomposition of the organic materials 113 in the pretreatment proceeds easily.

Further, when an excimer lamp which uses xenon as discharging gas, of which light has an emission center wavelength of 172 nm, is used as an ultraviolet irradiation device as represented by the formulas (1), (3) and (4), the organic material 113 is decomposed using active oxygen obtained directly form oxygen and active oxygen obtained from ozone with the use of light with an emission center wavelength of 172 nm. When the discharge substance is irradiated with light obtained from the lamp, bonds in the organic materials 113 are easily cut, oxidation by active oxygen is further promoted. Accordingly, decomposition of the organic materials 113 is easily proceeded in the pretreatment.

When active oxygen is not generated separately, irradiation with the ultraviolet ray is not necessarily performed from the above of the discharge substance 115. For example, irradiation with the ultraviolet ray may be performed from a side of the discharge substance 115. Further, irradiation with the ultraviolet ray is not always performed from one position. Note that the second conductive layer 112 needs to be provided so as to be opposed to the first conductive layer 110 with the memory layer 111 interposed therebetween. Therefore, at least a surface of the discharge substance 115 which is opposed to the first conductive layer 110 has to be exposed to active oxygen.

When a material easily oxidized is used for nanoparticles 114, an oxide film may be formed in nanoparticles included in the layer 116 to which pretreatment is performed, in some cases. The oxide film prevents lower resistance of the second conductive layer 112. In such a case, reduction treatment to remove the oxide film using atomic hydrogen is preferably used after pretreatment, which can suppress higher resistance of the second conductive layer 112 due to the oxide film of the nanoparticles 114. Further, this reduction treatment may also be performed when resistance of the layer 116 is reduced and baking is performed to form the second conductive layer 112. Atomic hydrogen can be generated by, for example, catalytic degradation in which a hydrogen molecule is contacted to a surface of a heated catalyst under reduced pressure and degraded into atomic hydrogens. Note that, as a catalyst, tungsten (W), platinum (Pt), molybdenum (Mo), palladium (Pd), tantalum (Ta), indium (In), nickel (Ni), vanadium (V), or the like can be used. Further, atomic hydrogen may be generated by plasma treatment.

A method for pretreatment is not limited to the above, the organic materials 113 covering the nanoparticles 114, which are included in the discharge substance 115 used for forming the second conductive layer 112, may be decomposed. For example, plasma treatment can be used, and pretreatment may be performed using an ultraviolet ray with a wavelength of greater than 240 nm. Note that plasma treatment may be performed using mixed gas of any one of oxygen, hydrogen, oxygen and hydrogen, oxygen and $CF_X$ (fluoro carbon), or the like and a rare gas (at least one of He, Ne, Ar, Kr, and Xe).

The film thickness of the memory layer 111 is not particularly limited; however, it is preferably greater than or equal to 1 nm and less than or equal to 250 nm. However, when the film thickness is too large, there is a possibility that the behavior differs in each memory element in application of voltage. Therefore, the thickness of the memory layer 111 needs to be determined as appropriate in consideration of the above. Note that, in the memory element of the present invention, writing voltage can be reduced as the memory layer 111 becomes thinner.

The first conductive layer 110 may also be formed by a droplet discharging method.

As described above, the memory element of the present invention can be simply manufactured with high yield. Since data once written to the memory element of the present invention cannot be erased, it is possible to prevent forgery by rewriting. Accordingly, the memory element with excellent performance and reliability can be manufactured at low cost.

The discharge substance 115 may be formed not only by a coating method by which discharging can be performed in a desired position, but also by a coating method such as a spin coating method in which a baking process is needed in manufacturing a conductive layer. In this case as well, as described above, pretreatment is performed, and then baking is performed, thereby forming a conductive layer using the layer 116 to which pretreatment is performed. After that, the layer 117 to which pretreatment is not performed and the conductive layer are etched to have desired shapes, whereby the memory layer 111 and the second conductive layer 112 can be formed and the memory element can be manufactured.

Note that, as the voltage which is applied to the memory element of the present invention, a higher voltage may be applied also to the first conductive layer 110 than the voltage applied to the second conductive layer 112, or a higher voltage may be applied also to the second conductive layer 112 than the voltage applied to the first conductive layer 110.

Figure 5:
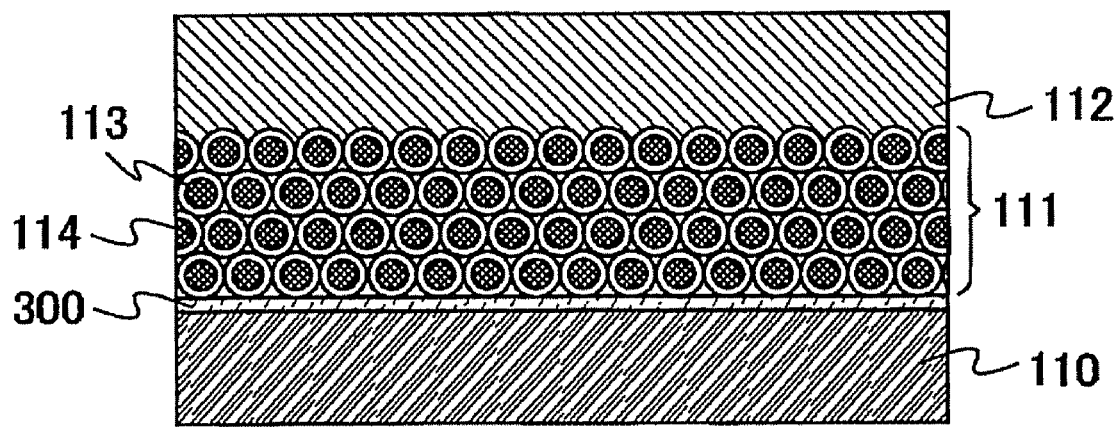
FIG. 5 is a view describing a structural example of the memory element of the present invention.

Further, the structure of the memory element is not limited to that illustrated in FIG. 1 but may be that illustrated in FIG. 5. A memory element illustrated in FIG. 5 has a first conductive layer 110, a layer 300, a memory layer 111, and a second conductive layer 112. The layer 300 and the memory layer 111 are provided between the first conductive layer 110 and the second conductive layer 112, and the memory layer 111 is formed on and in contact with the layer 300. Note that the film thickness of the layer 300 is not limited in particular; however, the film thickness of the layer 300 is preferably greater than or equal to 0.1 nm and less than or equal to 50 nm.

The layer 300 is an insulating layer, and can be formed using an inorganic or organic compound having an insulating property. For example, as an inorganic compound, an oxide such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), or barium oxide (BaO), a fluoride such as lithium fluoride (LiF), sodium fluoride (NaF), potassium fluoride (KF), rubidium fluoride (RbF), beryllium fluoride ($BeF_2$), magnesium fluoride ($MgF_2$), calcium fluoride ($CaF_2$), strontium fluoride ($SrF_2$), or barium fluoride ($BaF_2$), a nitride, chloride, bromide, iodide, carbonate, sulfate or nitrate, or the like which has an insulating property can be given. Further, as an organic compound having an insulating property, polyimide, an acrylic polymer, polyamide, a benzocyclobutene resin, polyester, a novolac resin, a melamine resin, a phenol resin, an epoxy resin, silicone resin, a furan resin, a diallyl phthalate resin, or the like can be used. Further, a so-called siloxane-based material in which the main chain is silicon-oxygen bond may be used.

By provision of the layer 300 as illustrated in FIG. 5, leakage current which would flow to an element to which data have not been written can be reduced in applying a read voltage. Accordingly, power consumption at the time of reading can be reduced.

Note that a writing voltage to a memory element of the present invention can be reduced by making the memory layer 111 thinner as described above. However, although the write voltage can be reduced when the memory layer 111 is thinned, if the film thickness is too thin, leakage current caused at the time of reading increases. In such a case, it is especially effective to provide the layer 300)

The layer 300 can be formed by an evaporation method, a sputtering method, a CVD method, a printing method, a spin coating method, a sol-gel method, a droplet discharging method, or the like. In particular, the insulating layer is preferably formed using an organic compound having an insulating property by a droplet discharging method. In this case, the insulating layer is formed by discharging a composition which is the organic compound or a reactant thereof is dissolved in an organic solvent onto a desired position and removing the solvent. Therefore, when a solvent which causes phase separation with the organic solvent used for forming the layer 300 is selected as a solvent of a discharged material for forming the memory layer 111 and the second conductive layer 112, that is, the discharged material into which nanoparticles formed of conductive materials are dispersed, the memory layer 111 and the second conductive layer 112 can be formed even when the organic solvent is not completely removed in forming the layer 300. Accordingly, a drying step is not necessarily performed for removing the solvent to form the layer 300 separately; for example, it is sufficient to heat the substrate provided with the first conductive layer 110 when the layer 300 is formed. Further, the drying step may also be combined with a later step of drying performed to the discharged material to form the memory layer 111 and the second conductive layer 112. Furthermore, since the layer 300 formed by a droplet discharging method using an organic compound having an insulating property has low density and high volume, increase in the write voltage caused by provision of the layer 300 hardly occurs and leakage current in reading, which flows to an element to which data have not been written can be reduced as compared to the layer 300 formed using other methods or other insulating materials.

The layer 300 may be a semiconductor layer, and can be formed using an inorganic semiconductor such as molybdenum oxide, tin oxide, bismuth oxide, silicon film, vanadium oxide, nickel oxide, zinc oxide, silicon germanium, gallium arsenide, gallium nitride, indium oxide, indium phosphide, indium nitride, cadmium sulfide, cadmium telluride, or strontium titanate film can be used.

The semiconductor layer can also be formed by a droplet discharging method or a printing method. Further, as another formation method, an evaporation method, a method using an electron beam, a sputtering method, a CVD method, a spin coating method, a sol-gel method, or the like may also be used.

As described above, provision of the insulating layer or the semiconductor layer between the first conductive layer and the memory layer makes it possible to reduce leakage current which flows to an element to which data have not been written in reading. Accordingly, power consumption can also be reduced.

Embodiment Mode 2

This embodiment mode will describe a semiconductor device having a memory element of the present invention, typically a memory device, with reference to the drawings. Here, a case where the structure of the memory device is a passive matrix type is shown.

Figure 6A:
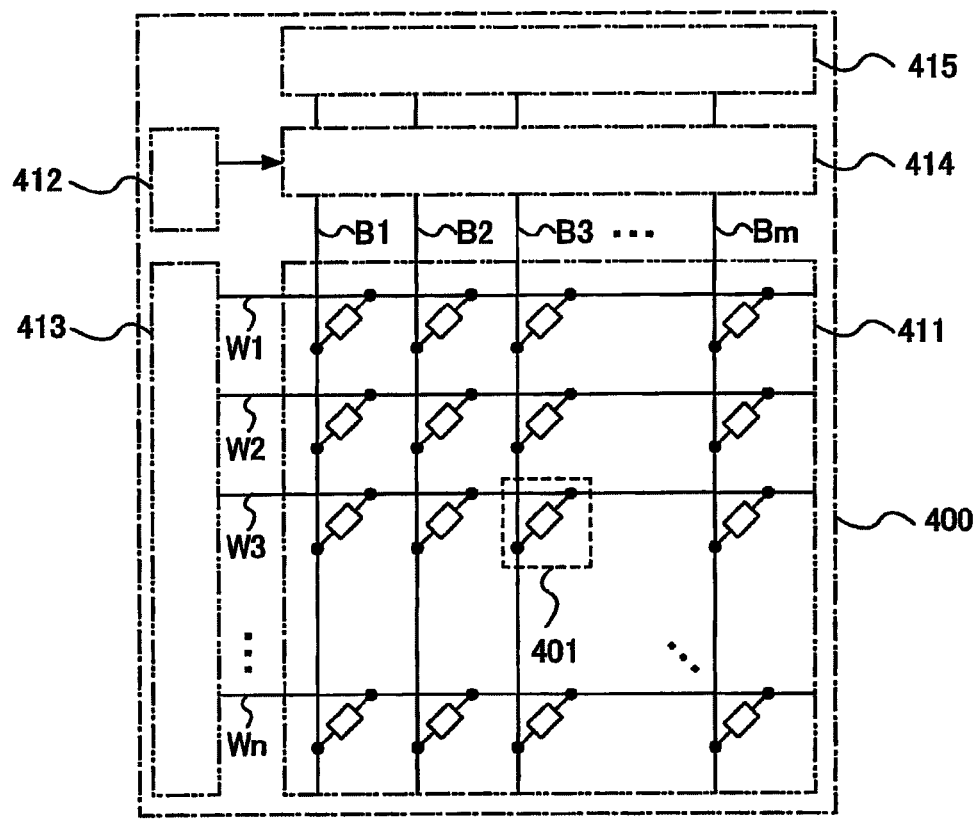
FIGS. 6A to 6C are views explaining a structural example of a semiconductor device of the present invention.

FIG. 6A illustrates a structural example of a semiconductor device shown in this embodiment mode. A semiconductor device 400 includes a memory cell array 411 where memory elements 401 are arranged in matrix, decoders 412 and 413, a selector 414, and a reading/writing circuit 415. The structure of the semiconductor device 400 which is shown here is only one example and the semiconductor device 400 may also have other circuits such as a sense amplifier, an output circuit, and a buffer.

The decoders 412 and 413, the selector 414, the reading/writing circuit 415, an interface, and the like may also be formed over a substrate similarly to the memory element. Alternatively, they may be attached externally as IC chips.

The memory element 401 includes a first conductive layer connected to a word line Wy ($1 \leq y \leq n$), a second conductive layer connected to a bit line Bx ($1 \leq x \leq m$), and a memory layer provided between the first conductive layer and the second conductive layer.

Figure 7A:
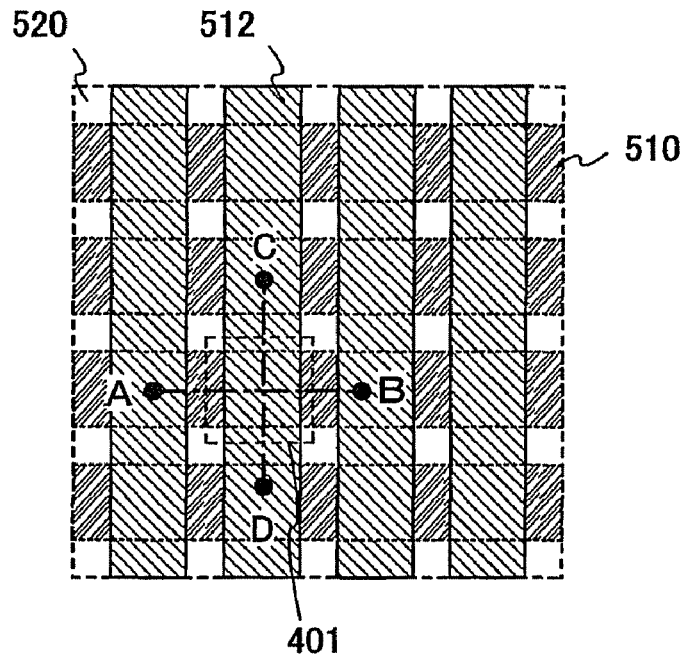
FIGS. 7A to 7C are views describing a memory cell included in a semiconductor device of the present invention.
Figure 7B:
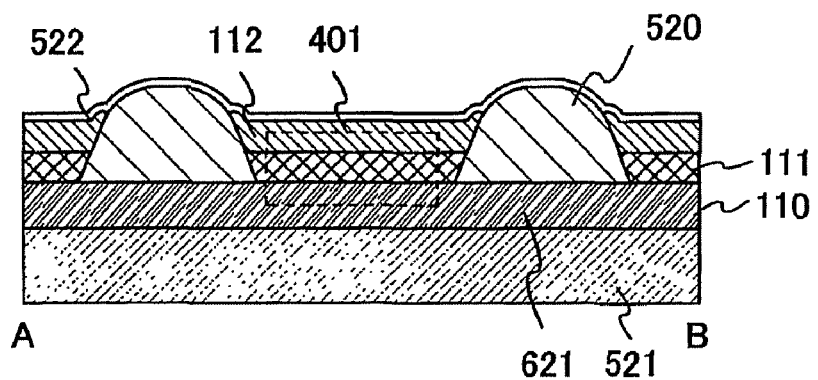
Figure 7C:
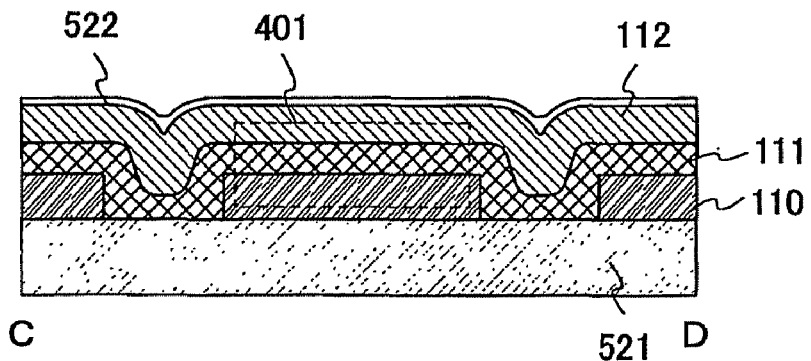

FIGS. 7A to 7C illustrate examples of a top view and cross-sectional views of the memory cell array 411, respectively. Note that FIG. 7A illustrates the top view of part of the memory cell array 411.

In the memory cell array 411, the memory elements 401 are arranged in matrix. The memory elements 401 each has, over the substrate, first conductive layers 510 extended in a first direction (A-B), and a memory layer and second conductive layers 512 extended in a second direction (C-D) perpendicular to the first direction. Note that partition walls (insulating layers) 520 extended in the second direction are each provided, between each of the plurality of the memory layers and the second conductive layers 512. The partition walls (insulating layers) 520 separate the memory elements adjacent in the first direction (A-B). Note that each layer used for the memory elements 401 can be formed using a substance described in Embodiment Mode 1. Further, the memory layer and the second conductive layer 512 are subjected to pretreatment before baking, whereby the memory layer and the second conductive layer can be formed using the same discharge substance in the same step. In FIG. 7A, an insulating layer serving as a protective film which is provided to cover the partition walls (insulating layers) 520 and the second conductive layers 512 is omitted.

Note that the first conductive layers 510 in this embodiment mode correspond to the first conductive layer 110 and the memory layer corresponds to the memory layer 111 in Embodiment Mode 1. Further, the second conductive layers 512 correspond to the second conductive layer 112 in Embodiment Mode 1. Portions similar to those in Embodiment Mode 1 are denoted by reference numerals in common, and detailed explanations of similar portions or portions having similar functions will not be repeated.

An example of a cross-sectional structure taken along line A-B in FIG. 7A is illustrated in FIG. 7B, and an example of a cross-sectional structure taken along line C-D in FIG. 7A is illustrated in FIG. 7C. As for a substrate 521 over which the memory elements 401 are provided, a quartz substrate, a silicon substrate, a metal substrate, a stainless steel substrate, paper made of a fiber material, or the like can be used in addition to a glass substrate or a flexible substrate. A flexible substrate refers to a substrate that can be bent (flexible), and a plastic substrate made of polycarbonate, polyarylate, polyethersulfone, or the like can be given, for example. In addition, a film (a film made of polypropylene, polyester, polyvinyl fluoride, polyvinyl chloride, or the like) can also be used.

Further, a thin film transistor (TFT) may also be provided over a substrate having an insulating property and the memory elements 401 may also be provided thereover. Alternatively, instead of the above substrate, a semiconductor substrate such as a Si substrate or an SOI substrate may also be used to form a field-effect transistor (FET) over the substrate, and the memory elements 401 may also be provided thereover. In addition, the memory elements 401 may be attached to the thin film transistor or the field-effect transistor. In this case, the memory element and the thin film transistor or the field-effect transistor are manufactured through different processes from each other, and then the thin film transistor or the field-effect transistor can be provided by being attached to the memory element with the use of a conductive film, an anisotropic conductive adhesive, or the like.

In FIGS. 7B and 7C, first, the first conductive layers 110 are formed over the substrate 521 by an evaporation method, a sputtering method, a CVD method, a printing method, an electrolytic plating method, an electroless plating method, a droplet discharging method, or the like. Next, the partition walls (insulating layers) 520 are formed by a sputtering method, a CVD method, a printing method, a droplet discharging method, a spin coating method, an evaporation method, or the like. Note that partition walls (insulating layers) 520 may be formed using an inorganic insulating material such as silicon oxide, silicon nitride, silicon oxynitride; acrylic acid, methacrylic acid, a derivative thereof, a heat-resistant polymer such as polyimide, aromatic polyamide, polybenzimidazole, or a siloxane resin. Further, a vinyl resin such as polyvinyl alcohol or polyvinyl butyral, a resin material such as an epoxy resin, a phenol resin, a novolac resin, an acrylic resin, a melamine resin or a urethane resin may be used; alternatively, an organic material such as benzocyclobutene, parylene, fluorinated arylene ether, or polyimide, a composition containing a water-soluble homopolymer and a water-soluble copolymer, or the like may be used. In the cross section taken along line A-B, that is, in the cross sections of the partition walls (insulating layers) 520 illustrated in FIG. 7B, it is preferable that the side surfaces of the partition walls (insulating layers) 520 be inclined by an angle of greater than or equal to 10 degrees and less than 60 degrees, preferably, greater than or equal to 25 degrees and less than or equal to 45 degrees with respect to the surfaces of the first conductive layers 110. Alternatively, it is preferable that the partition walls (insulating layers) 520 be curved. With such a shape, when the memory layer 111 and the second conductive layer 112 is formed by a coating method such as a droplet discharging method, a composition to be discharged can be prevented from unnecessarily running off a desired position.

Next, a composition in which nanoparticles which are formed of conductive materials and covered with organic materials are dispersed in a solvent is discharged over the first conductive layer 110 by a coating method such as a droplet discharging method, and then the solvent is vaporized by drying. Then, the pretreatment is performed to the discharge substance remaining over the first conductive layer 110, that is, nanoparticles covered with organic materials, thereby reducing a sintering temperature of nanoparticles which are positioned on a surface. Then, only nanoparticles of which sintering temperature is reduced is sintered to form the second conductive layer 112 by baking. Note that nanoparticles in the discharge substance which is not sintered is used as the memory layer 111. In this manner, the memory element 401 is manufactured.

Further, an insulating layer 522 serving as a protective film is preferably provided so as to cover the partition walls (insulating layers) 520 and the second conductive layer 112. As the protective film, silicon oxide, silicon nitride, silicon oxynitride, or the like can be used, which can prevent penetration of moisture, oxygen, or the like.

In the cross section taken along line C-D, that is, the cross section of the first conductive layer 110 illustrated in FIG. 7C, it is preferable that the side surface of the first conductive layer 110 be almost perpendicular or be inclined by an angle of greater than or equal to 10° and less than 90° with respect to a surface of the substrate 521. The first conductive layer 110 may have a curved shape in which the curvature radius changes continuously. Note that "almost perpendicular" means 90° (±1°) here. With such a shape, the coverage of the memory layer 111, the second conductive layer 112, and the like stacked over the first conductive layer 110 can be preferable.

Note that since the a composition used for forming the memory layer 111 and the second conductive layer 112, that is, a discharged material is liquid, so that it is greatly affected by a surface state of a formation region. Accordingly, the partition walls (insulating layers) 520 may be subjected to a treatment to control wettability. The wettability of the solid surface is affected by the chemical property and the physical surface shape (surface roughness) of the surface. A treatment to control wettability of a surface in the present invention means forming regions having different wettabilities with respect to the discharged material on a region where the liquid discharged material is applied. Note that the regions having different wettabilities are regions having different wettabilities with respect to discharged materials, that is, regions having different contact angles with respect to a discharged material. A region having a larger contact angle with respect to a discharged material is a region having lower wettability (hereinafter also referred to as a low wettability region), and a region having a smaller contact angle is a region having higher wettability (hereinafter also referred to as a high wettability region). When a contact angle is large, a liquid discharged material does not spread on a surface where the discharged material is applied, while the discharged material spreads if the contact angle is small. Thus, regions having different wettabilities have different surface energies, and the surface energy of a region having low wettability is low, while the surface energy of a region having high wettability is high.

Note that the difference of wettabilities is relative to each region. Here, a low wettability region is formed on the partition walls (insulating layers) 520 on which the memory layer 111 and the second conductive layer 112 are formed; thus, two regions having different wettability can be formed. As a method for selectively forming the low wettability region, a method in which a layer containing low wettability substance is selectively formed by forming and using a mask layer, a method in which surface treatment is performed to change wettability (e.g. lowering wettability) selectively, or the like can be used.

For example, as a method for changing and controlling surface wettability, there is a method in which wettability is changed by decomposing a surface substance and modifying a region surface with the use of light irradiation energy. As the low wettability substance, a substance containing a fluorocarbon group (or fluorocarbon chain) or a substance containing a silane coupling agent can be used. The silane coupling agent can form a monomolecular film; therefore, modification can be efficiently carried out and wettability can be changed in a short time. In addition, not only a silane coupling agent having a fluorocarbon chain but also that having an alkyl group can be used, because the silane coupling agent having an alkyl group exhibits low wettability when arranged over a substrate. Further, as the low-wettability substance, a titanate coupling agent and an aluminate coupling agent may also be used.

A liquid discharged material moves to a side where wettability is high; thus, a pattern can be formed in a more accurate position. Further, use efficiency of the material can be improved.

Figure 8A:
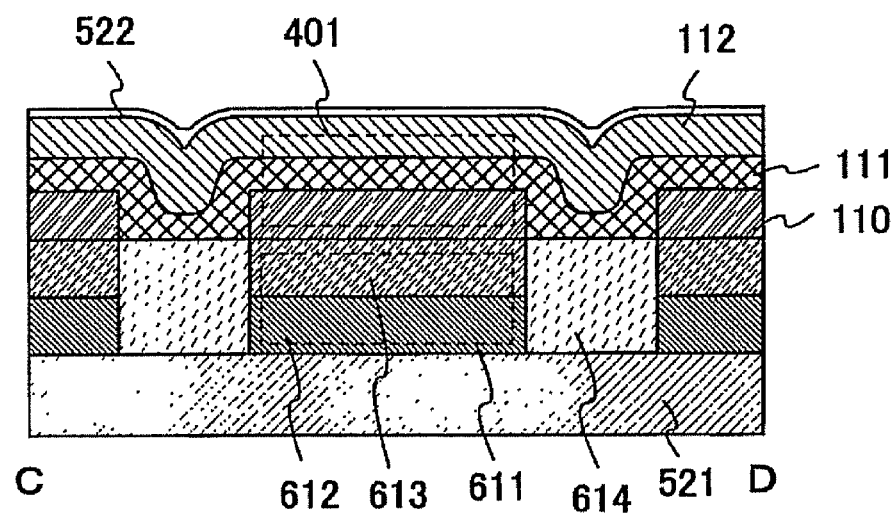
FIGS. 8A and 8B are views describing a structural example of the memory element of the present invention.

Further, as illustrated in the cross-sectional structure taken along line C-D in FIG. 8A, an element having a rectifying property may be provided between a first conductive layer 110 and a substrate 521 in a memory element 401. As the element having a rectifying property, a Schottky-barrier diode, a PIN diode, a PN diode, or a diode-connected transistor, and the like can be given. Here, a diode 611 including a third conductive layer 612 and a semiconductor layer 613 is provided under and in contact with the first conductive layer 110. Note that the diode 611 corresponding to each memory element is isolated by an interlayer insulating film 614. In addition, the element having a rectifying property may be provided on the opposite side of a memory layer 111 so as to be in contact with a second conductive layer 112.

Figure 8B:
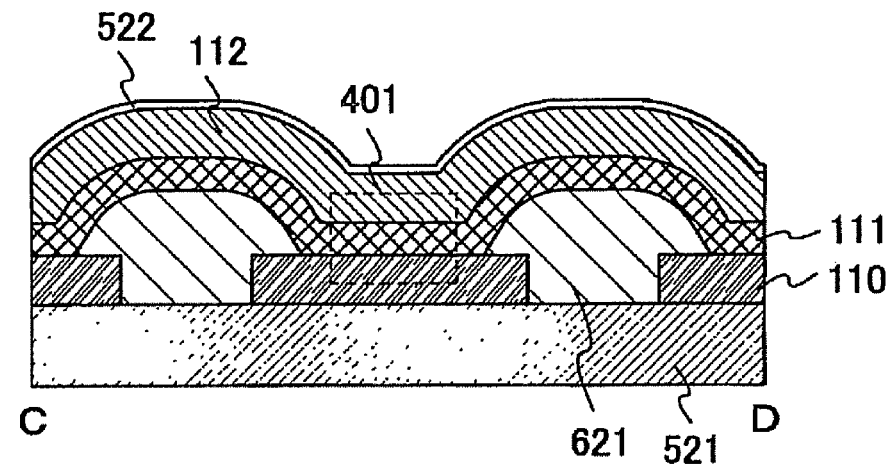

Further, if an effect of an electric field on between memory elements adjacent to the second direction (C-D) is a concern, partition walls (insulating layer) 621 may be provided between each first conductive layer 110 of the memory elements as illustrated in FIG. 8B. Thus, an effect of an electric field between adjacent memory elements can be prevented, and in addition to that, breakage of these layers which is caused by steps of the first conductive layer 110 can be prevented when the memory layer 111 and the second conductive layer 112 are provided so as to cover the first conductive layer 110.

Note that, in the cross sections of the partition walls (insulating layers) 621 illustrated in FIG. 8B, it is preferable that the side surfaces of the partition walls (insulating layers) 621 be each inclined by an angle of greater than or equal to 10° and less than 60°, preferably, greater than or equal to 25° and less than or equal to 45° with respect to the surfaces of the first conductive layers 110. Further, it is preferable that the partition walls (insulating layers) 621 be curved. In this manner, the partition walls (insulating layers) 621 are provided, and then, the memory layer 111 and the second conductive layer 112 are formed so as to cover the first conductive layer 110 and the partition walls (insulating layers) 621 in the same step.

Next, an operation in writing data in a memory element will be described. Here, a case of writing data by an electric action, typically by application of voltage, will be described with reference to FIGS. 6A to 6C. Note that the data is written by change of the electrical characteristics of the memory element. "0" and "1" refer to data in an initial state (a state where an electric action is not applied) of the memory element and data in a state where the electrical characteristics are changed, respectively.

When data "1" is written to the memory element 401, first, the memory element 401 is selected by the decoders 412 and 413, and the selector 414. Specifically, predetermined potential V2 is applied to the word line W3 connected to the memory element 401 by the decoder 413. In addition, the bit line B3 connected to the memory element 401 is connected to the reading/writing circuit 415 by the decoder 412 and the selector 414. Then, writing potential V1 is output to the bit line B3 from the reading/writing circuit 415. Thus, a voltage Vw=V–V2 is applied between the first conductive layer and the second conductive layer included in the memory element 401. By proper selection of the voltage Vw, a memory layer which is provided between the conductive layers is changed physically or electrically, so that the data "1" is written. Specifically, as for a readout operation voltage, electric resistance between the first and second conductive layers when the memory element 401 is in the state of the data "1" may be largely lowered than electric resistance therebetween when the memory element 401 is in the state of data "0". For example, the first and second conductive layers may be short-circuited (shorted). The voltage Vw may be set to be greater than or equal to 5 V and less than or equal to 15 V or greater than or equal to –15 and less than or equal to –5 V, for example.

Further, non-selected word lines and non-selected bit lines are controlled so that the data "1" is not written to the memory element which is connected. For example, the non-selected word lines and the non-selected bit lines may be made in a floating state. In addition, potential set to be the same degree as that of the second conductive layer may be applied to the non-selected word lines.

When data "0" is written to the memory element 401, an electric action may not be applied to the memory element 401. As for a circuit operation, for example, the memory element 401 is selected by the decoders 412 and 413, and the selector 414 as well as the case of writing data "1"; however, the output potential from the reading/writing circuit 415 to the bit line B3 is set to be the same degree as potential of the selected word line W3 or potential of the non-selected word lines, and a voltage (for example, greater than or equal to –5 V and less than or equal to 5 V), by which an electrical characteristic of the memory element 401 is not changed, may be applied between the first and second conductive layers included in the memory element 401.

Figure 6B:
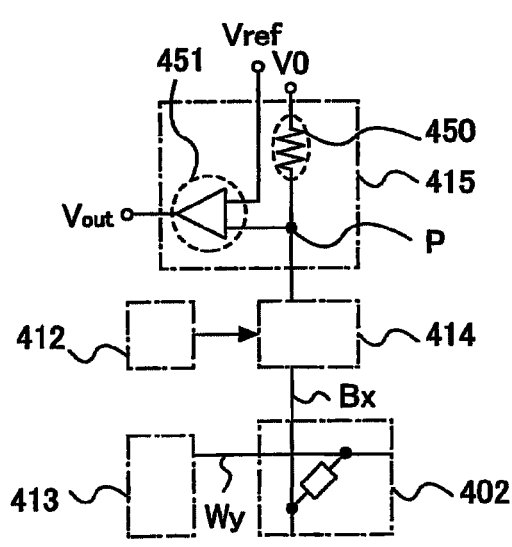
Figure 6C:
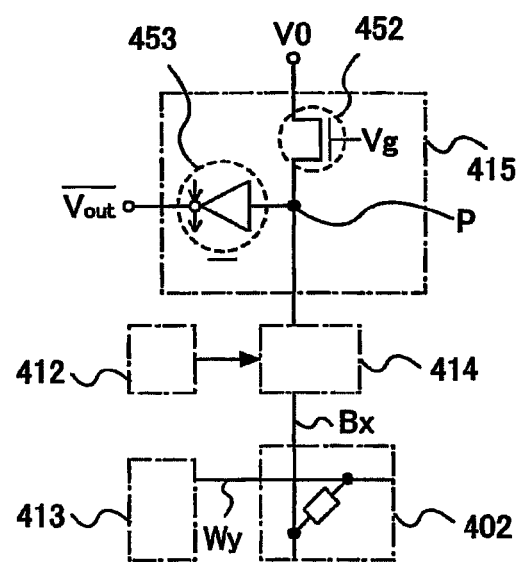

Subsequently, an operation when data is read out from the memory element will be described with reference to FIG. 6B. Data is read out by utilizing a difference in electrical characteristics between the first and second conductive layers, of a memory element having the data "0" and a memory element having the data "1". For example, a method for reading out data by utilizing a difference in electric resistance when effective electric resistance between the first and second conductive layers included in the memory element having the data "0" (hereinafter, simply referred to as electric resistance of the memory element) is R0 at a reading voltage and electric resistance of the memory element having data "1" is R1 at a reading voltage, will be described. Note that R1<<R0. As a structure of a readout portion of the reading/writing circuit 415, for example, a circuit including a resistance element 450 and a differential amplifier 451 as illustrated in FIG. 6B can be used. The resistance element 450 has resistance Rr and R1<Rr<R0. A transistor 452 may be used as a substitute for the resistance element 450 as illustrated in FIG. 6C, or a clocked inverter 453 can also be used as a substitute for the differential amplifier 451. A signal φ or an inversion signal thereof, which becomes High when data is read out and becomes Low when no data is read out, is input in the clocked inverter 453. Note that the circuit configurations are not limited to those illustrated in FIGS. 6B and 6C.

When data is read out from a memory element 402, first, the memory element 402 is selected by decoders 412 and 413, and the selector 414. Specifically, predetermined potential Vy is applied to a word line Wy connected to the memory element 402 by the decoder 413. In addition, a bit line Bx connected to the memory element 402 is connected to a terminal P of the reading/writing circuit 415 by the decoder 412 and the selector 414. As a result, potential Vp of the terminal P becomes a value determined by resistance division generated by the resistance element 450 (resistance Rr) and the memory element 402 (resistance R0 or R1). Therefore, when the memory element 402 has the data "0", potential Vp0 of the terminal P is Vp0=Vy+(V0−Vy)×R0/(R0+Rr). Moreover, when the memory element 402 has the data "1", potential Vp1 of the terminal P is Vp1=Vy+(V0−Vy)×R1/(R1+Rr). As a result, Low/High (or High/Low) is output as output potential Vout in accordance with the data "0" and data "1", and data can be read out by selecting Vref to be between Vp0 and Vp1 in FIG. 6B and selecting a variation point of the clocked inverter 453 to be between Vp0 and Vp1 in FIG. 6C.

For example, the differential amplifier 451 is set to operate at Vdd=3 V, and Vy is set to be 0 V; V0, 3 V; and Vref, 1.5 V. If R0/Rr=Rr/R1=9, when the memory element has the data "0", Vp0 becomes 2.7 V and High is output as Vout. When the memory element has the data "1", Vp1 becomes 0.3 V and Low is output as Vout. Thus, data can be read out from the memory element.

According to the above method, a state of electric resistance of the memory layer is read out by a voltage value by utilizing a difference in resistance and resistance division. Note that the readout method is not limited thereto. For example, the state of electric resistance of the memory layer may be read out by utilizing a difference in a current value instead of utilizing a difference in electric resistance. When an electronic characteristic of a memory element has a diode property in which a threshold voltage differs between the data "0" and the data "1", the state of electric resistance of the memory layer may be read out by utilizing a difference in threshold voltage.

In addition, a thin film transistor (TFT) may be provided over a substrate having an insulating property, and the memory element or a memory element array may be provided thereover. Alternatively, instead of the substrate having an insulating property, a semiconductor substrate such as a Si substrate or an SOI substrate may be used to form a field-effect transistor (FET) over the substrate, and the memory element or a memory element array may be provided thereover.

Regarding the semiconductor device described in this embodiment mode, data can be written not only once but can also be written additionally. Since data once written to the memory element cannot be erased, it is possible to prevent forgery by rewriting. Further, since the semiconductor includes the memory element of the present invention, which can be simply manufactured with high yield, a semiconductor device with excellent performance and reliability can be manufactured at low cost.

Note that this embodiment mode can be combined with any of the other embodiment modes as appropriate. Therefore, in the memory element included in the semiconductor device described in this embodiment mode, for example, an insulating layer or a semiconductor layer may be provided between the first conductive layer and the memory layer.

Embodiment Mode 3

Figure 9A:
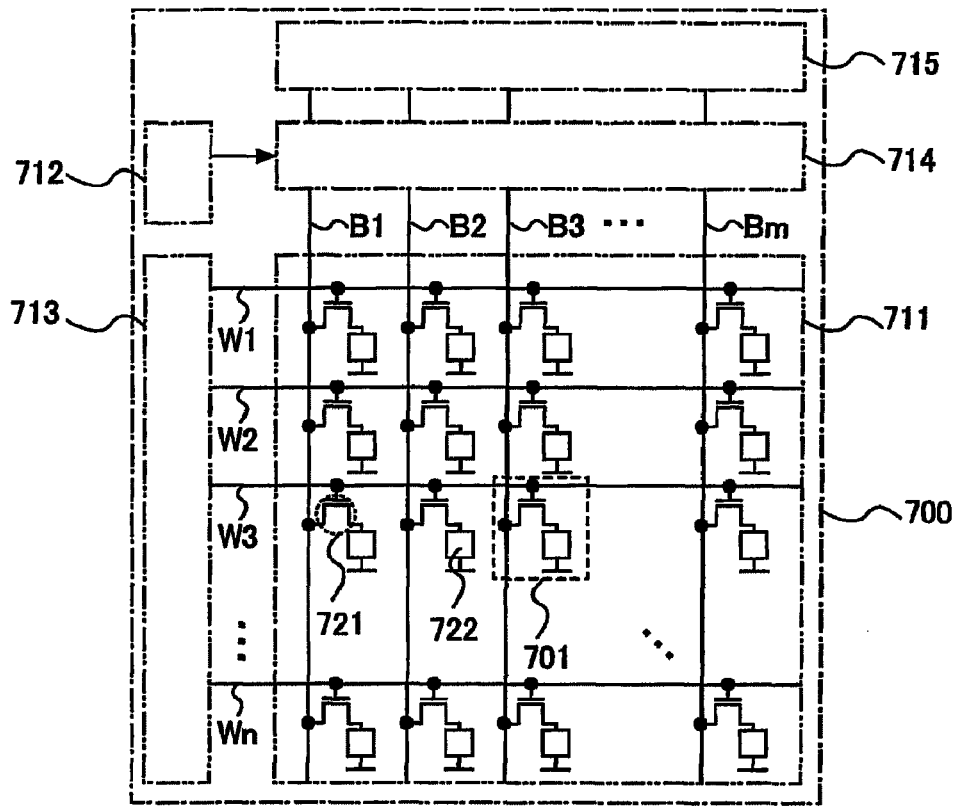
FIGS. 9A to 9C are views describing a structural example of a semiconductor device of the present invention.
Figure 9B:
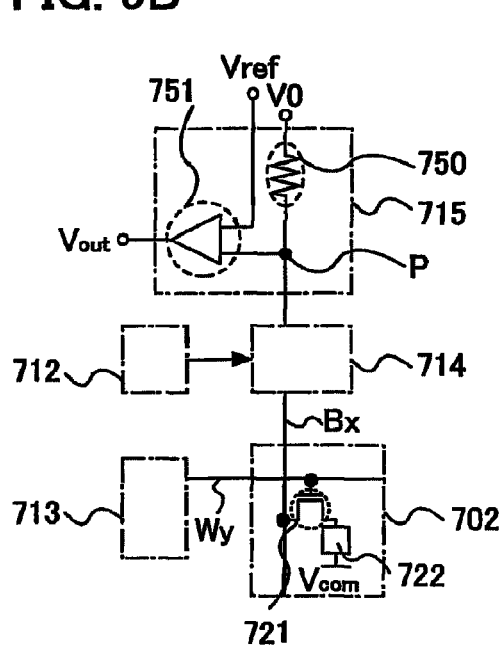
Figure 9C:
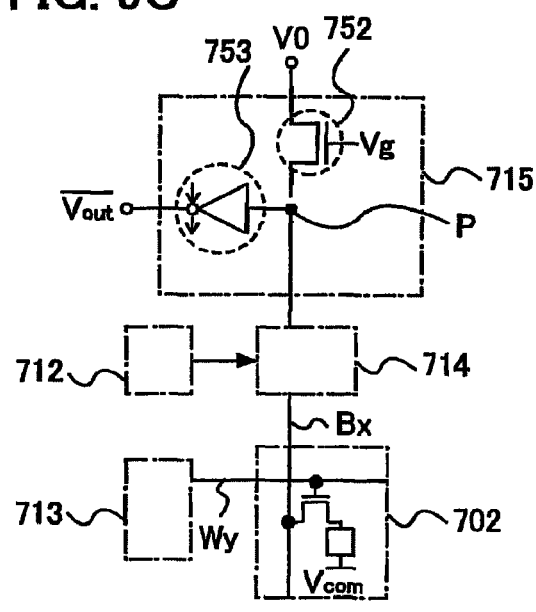

This embodiment mode will describe a semiconductor device having a memory element of the present invention with reference to FIGS. 9A to 9C. Specifically, this embodiment mode will describe an active-matrix memory device.

FIG. 9A illustrates a structural example of a semiconductor device described in this embodiment mode. A semiconductor device 700 includes a memory cell array 711 where memory cells 701 are arranged in matrix, decoders 712 and 713, a selector 714, and a reading/writing circuit 715. The structure of the semiconductor device 700 described here is only one example and the semiconductor device 700 may also include other circuits such as a sense amplifier, an output circuit, or a buffer.

The decoders 712 and 713, the selector 714, the reading/writing circuit 715, an interface, and the like may also be formed over a substrate as with a memory element. Alternatively, they may be attached externally as IC chips.

The memory cell 701 includes a first wiring connected to a bit line Bx ($1 \leq x \leq m$), a second wiring connected to a word line Wy ($1 \leq y \leq n$), a thin film transistor 721, and a memory element 722. The memory element 722 has a structure where a memory layer is interposed between a pair of conductive layers.

Next, an example of a top view and cross-sectional views of the memory cell array 711 having the above structure will be described with reference to FIGS. 10A to 10C. Note that FIG. 10A is the top view of part of the memory cell array 711.

In the memory cell array 711, a plurality of the memory cells 701 are arranged in matrix. Alternatively, in the memory cell 701, a thin film transistor 721 serving as a switching element and a memory element connected to the thin film transistor 721 are provided over a substrate having an insulating surface.

Figure 10A:
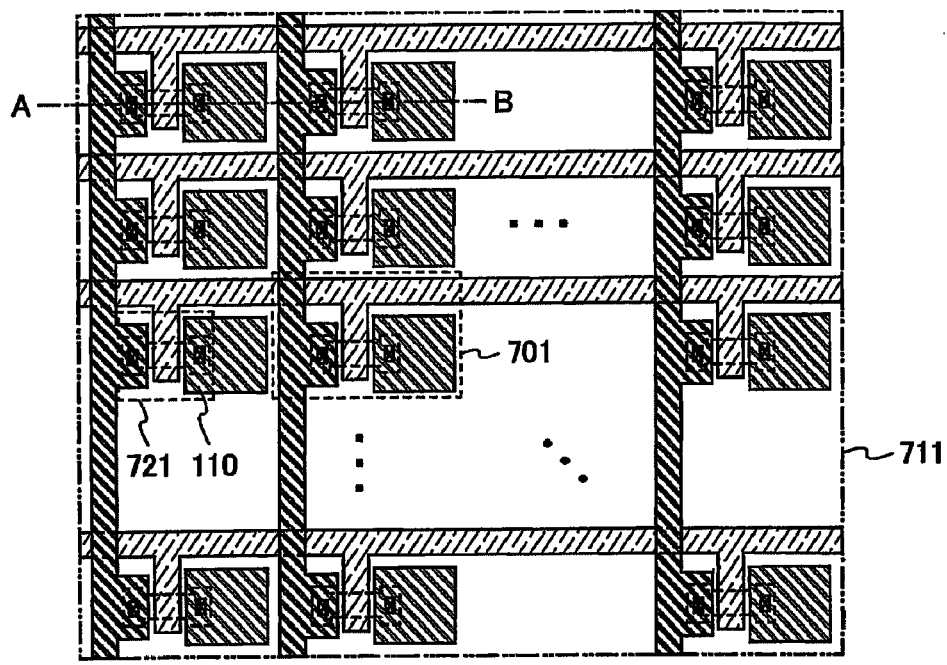
FIGS. 10A to 10C are views describing a memory cell included in a semiconductor device of the present invention.
Figure 10B:
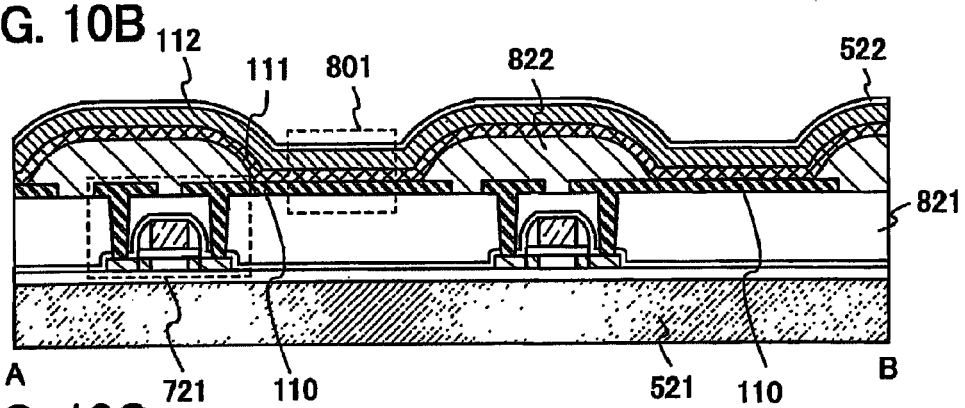

FIG. 10B shows an example of a cross-sectional structure taken along line A-B in FIG. 10A. Note that, in FIG. 10A, partition walls (insulating layers) 822, a memory layer 111, a second conductive layer 112, and an insulating layer 522 which are provided over first conductive layers 110 are omitted.

The memory cell 701 includes the thin film transistor 721, a memory element 801, an insulating layer 821, and the partition wall (insulating layer) 822 covering part of the first conductive layers 110. Note that the insulating layer 522 serving as a protective film is provided to cover the memory element 801. The memory element 801 connected to the thin film transistor 721 which is formed over a substrate 521 having an insulating surface includes the first conductive layer 110, the memory layer 111, and the second conductive layer 112 which are formed over the insulating layer 821. The memory layer 111 includes nanoparticles formed of a conductive material, which are covered with an organic material as described above. Further, the thin film transistor 721 is not particularly limited as long as it serves as a switch, and a portion corresponding to the thin film transistor 721 is not necessarily a thin film transistor.

Figure 11A:
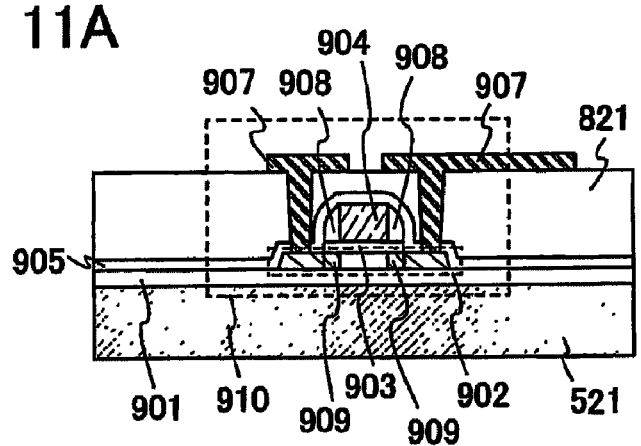
FIGS. 11A to 11D are views each describing one mode of a thin film transistor.

One mode of the thin film transistor 721 will be described with reference to FIGS. 11A to 11D. FIG. 11A shows an example of applying a top gate type thin film transistor. An insulating layer 901 is provided over a substrate 521 as a base film, and a thin film transistor 910 is provided over the insulating layer 901. In the thin film transistor 910, a semiconductor layer 902 and an insulating layer 903 serving as a gate insulating layer are provided over the insulating layer 901, and further a gate electrode 904 is formed over the semiconductor layer 902 with the insulating layer 903 interposed therebetween. Note that an insulating layer 905 serving as a protective layer and an insulating layer 821 serving as an interlayer insulating layer are provided over the thin film transistor 910. Further, wirings 907 each connected to a source region and a drain region of the semiconductor layer are formed.

An insulating film such as a silicon oxide film, a silicon nitride film, or a silicon oxynitride film is used to form the insulating layer 901, which is formed in a single layer or a multilayer of two or more layers of these insulating films. Note that the insulating layer 901 may be formed by a sputtering method, a CVD method, or the like.

For the semiconductor layer 902, a crystalline semiconductor film such as polysilicon may also be used, as well as an amorphous semiconductor such as amorphous silicon, a semiamorphous semiconductor, or a microcrystalline semiconductor.

In particular, a crystalline semiconductor formed by crystallization of an amorphous or microcrystalline semiconductor by laser light irradiation, a crystalline semiconductor formed by crystallization of an amorphous or microcrystalline semiconductor by heat treatment, or a crystalline semiconductor formed by crystallization of an amorphous or microcrystalline semiconductor by combination of heat treatment and laser light irradiation is preferably used. In the heat treatment, a crystallization method using a metal element such as nickel, which has a function of promoting crystallization of a silicon semiconductor, can be employed.

In the case of the crystallization with laser light irradiation, it is possible to perform crystallization in such a way that a portion in a crystalline semiconductor that is melted by irradiation with laser light is continuously moved in a direction where the laser light is emitted, where the laser light is continuous wave laser light or ultrashort pulsed laser light having a high repetition rate of greater than or equal to 10 MHz and a pulse width of less than or equal to 1 nanosecond, preferably 1 picosecond to 100 picoseconds. With the use of such a crystallization method, a crystalline semiconductor having a large grain diameter with a crystal grain boundary extending in one direction can be obtained. By a drift direction of carriers being made to conform to the direction where the crystal grain boundary extends, the electric field effect mobility in the transistor can be increased. For example, greater than or equal to 400 $cm^2/V \cdot sec$ can be achieved.

A large glass substrate can be used in the case of applying the above crystallization process to a crystallization process where the temperature is less than or equal to the heat resistant temperature of a glass substrate (approximately 600° C.). Therefore, a large number of semiconductor devices can be manufactured with one substrate, and cost can be decreased.

With the use of a substrate that can withstand heat temperature, the semiconductor layer 902 may be formed by a crystallization process which is performed by heating at the temperature higher than a heat resistant temperature of a glass substrate. Typically, a quartz substrate is used as the insulating substrate and an amorphous or microcrystalline semiconductor is heated at temperatures of greater than or equal to 700° C. to form the semiconductor layer 902. As a result, a semiconductor with high crystallinity can be formed. In this case, a thin film transistor which is superior in response speed, mobility, and the like and which is capable of a high-speed operation can be provided.

The gate electrode 904 can be formed using metal or a polycrystalline semiconductor doped with an impurity having one conductivity type. When the gate electrode 904 is formed using metal, tungsten (W), molybdenum (Mo), titanium (Ti), tantalum (Ta), aluminum (Al), or the like can be used. In addition, a metal nitride formed by nitriding of metal can be used. Alternatively, the gate electrode 904 may have a structure in which a first layer formed of the metal nitride and a second layer formed of the metal are stacked. When the gate electrode 904 has a stacked-layer structure, a so-called hat shape, where an end portion of the first layer may protrude from an end portion of the second layer, may be employed. In this case, when the first layer is formed using a metal nitride, the first layer can serve as a barrier metal. In other words, the first layer can prevent metal contained in the second layer from dispersing into the insulating layer 903 and the underlying semiconductor layer 902.

Note that sidewalls (sidewall spacers) 908 may be provided on the side faces of the gate electrode 904. An insulating layer is formed by a CVD method and anisotropic etching is performed on the insulating layer by an RIE (Reactive Ion Etching) method, so that the sidewalls can be formed.

The transistor formed by combination of the semiconductor layer 902, the insulating layer 903, the gate electrode 904, and the like can employ various kinds of structures such as a single drain structure, an LDD (lightly doped drain) structure, and a gate overlapped drain structure. FIG. 11A shows a thin film transistor having an LDD structure in which low concentration impurity regions 909 are formed in the semiconductor layer overlapped with the sidewalls. In addition, a single gate structure, a multi-gate structure, in which transistors, to which gate voltage having the same potential in terms of equivalence, are connected in series, or a dual-gate structure in which a semiconductor layer is interposed between gate electrodes can also be employed.

The insulating layer 821 is formed with an inorganic insulating material such as silicon oxide and silicon oxynitride or an organic insulating material such as an acrylic resin and a polyimide resin. When a coating method such as spin coating and roll coater is used, after coating of an insulating material which is dissolved in an organic solvent, the material is subjected to heat treatment, so that an insulating layer containing silicon oxide can be used. For example, a coating film containing siloxane is formed so that an insulating layer which can be formed by heat treatment at 200° C. to 400° C. can be used. When an insulating layer formed by a coating method or an insulating layer which is planarized by reflow is used as the insulating layer 821, disconnection of a wiring provided over the insulating layer can be prevented. Further, the insulating layer formed by such a method can be used effectively in formation of a multilayer wiring.

The wirings 907 formed over the insulating layer 821 can be provided to intersect with a wiring formed in the same layer as the gate electrode 904 and a multilayer wiring structure is formed. A plurality of insulating layers having a function similar to that of the insulating layer 821 are stacked and a wiring is formed thereover, so that a multilayer wiring structure can be formed. The wiring 907 is preferably formed in combination of a low resistance material such as aluminum (Al) and a barrier metal using a high melting point metal material such as titanium (Ti) or molybdenum (Mo), in a stacked-layer structure of titanium (Ti) and aluminum (Al), a stacked-layer structure of molybdenum (Mo) and aluminum (Al), or the like.

Figure 11B:
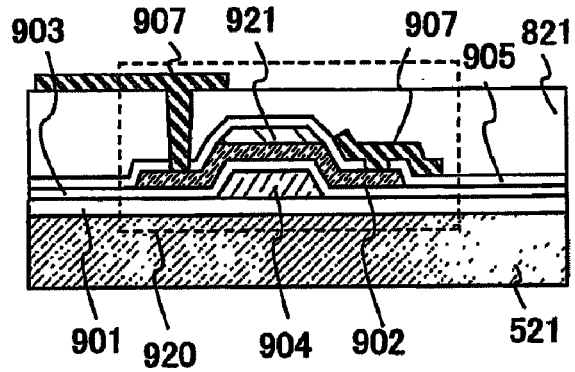

FIG. 11B shows an example of applying a bottom-gate type thin film transistor. An insulating layer 901 is formed over an insulating substrate 521, and a thin film transistor 920 is provided thereover. In the thin film transistor 920, a gate electrode 904, an insulating layer 903 serving as a gate insulating layer, and a semiconductor layer 902 are provided, and a channel protective layer 921, an insulating layer 905 serving as a protective layer, and an insulating layer 821 serving as an interlayer insulating layer are provided thereover. Further, an insulating layer serving as a protective layer may also be provided thereover. Wirings 907 each connected to a source region and a drain region of the semiconductor layer can be formed over the insulating layer 905 or the insulating layer 821. Note that the insulating layer 901 may not be provided in the case of the bottom-gate type thin film transistor.

When the substrate 521 is a flexible substrate, the substrate 521 has a lower heat resistant temperature as compared to a non-flexible substrate such as a glass substrate. Therefore, the semiconductor layer included in the thin film transistor is preferably formed using an organic semiconductor.

Figure 11C:
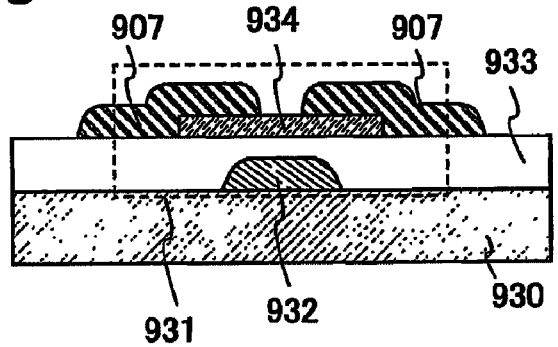

Here, a structure of a thin film transistor formed using an organic semiconductor for a semiconductor layer will be described with reference to FIGS. 11C and 11D. FIG. 11C shows an example where a staggered organic semiconductor transistor is employed. An organic semiconductor transistor 931 is provided over a flexible substrate 930. The organic semiconductor transistor 931 includes a gate electrode 932, an insulating layer 933 serving as a gate insulating film and a semiconductor layer 934 which is provided in a place where the gate electrode 932 and the insulating layer 933 are overlapped, and wirings 907 are connected to the semiconductor layer 934. Note that the semiconductor layer is in contact with the insulating layer 933 serving as a gate insulating film and the wirings 907.

The gate electrode 932 can be formed using a material and a method similar to those of the gate electrode 904. In addition, the gate electrode 932 can be formed by being dried and baked with the use of a droplet discharging method. Moreover, a paste containing fine particles is printed over the flexible substrate by a printing method and the paste is dried and baked so that the gate electrode 932 can be formed. As typical examples of fine particles, fine particles mainly containing any one of gold, copper, an alloy of gold and silver, an alloy of gold and copper, an alloy of silver and copper, and an alloy of gold, silver, and copper may also be used. Further, fine particles containing conductive oxide such as indium tin oxide (ITO) as their main component may also be used.

The insulating layer 933 serving as a gate insulating film can be formed using a material and a method similar to those of the insulating layer 903. However, when the insulating layer is formed by heat treatment after coating of a material for an insulating film which is dissolved in an organic solvent, the heat treatment is performed at a temperature lower than a heat resistant temperature of the flexible substrate.

As a material for the semiconductor layer 934 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetracyanoquinodimethane), PTCDA (a perylene carboxylic acid anhydrous compound), NTCDA (a naphthalenecarboxylic acid anhydrous compound), or the like can be used. Moreover, as a material for the semiconductor layer 934 of the organic semiconductor transistor, a π-conjugated system high molecular weight compound such as an organic high molecular compound, carbon nanotube, polyvinyl pyridine, a phthalocyanine metal complex, and the like can be given. In particular, a π-conjugated system high molecular weight having a conjugated double bond such as polyacetylene, polyaniline, polypyrrole, polythienylene, a polythiophene derivative, poly(3alkylthiophene), a polyparaphenylene derivative, or a polyparaphenylenevinylene derivative, is preferably used.

As a method for forming the semiconductor layer of the organic semiconductor transistor, an evaporation method, a coating method, a spin coating method, a bar coating method, a solution casting method, a dip coating method, a screen printing method, a roll coating method, or a droplet discharging method can be used. The thickness of the semiconductor layer is greater than or equal to 1 nm and less than or equal to 1000 nm, preferably, greater than or equal to 10 nm and less than or equal to 100 nm.

Figure 11D:
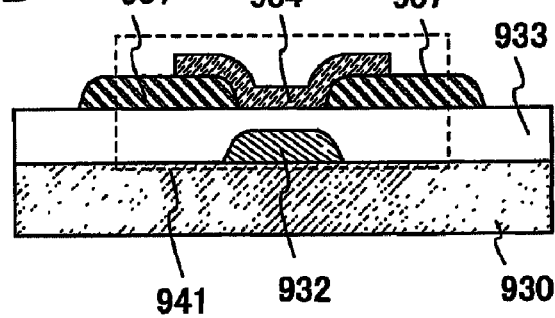

FIG. 11D shows an example of applying a coplanar organic semiconductor transistor. An organic semiconductor transistor 941 is provided over a flexible substrate 930. The organic semiconductor transistor 941 includes a gate electrode 932, an insulating layer 933 serving as a gate insulating film, a semiconductor layer 934 which is provided in a place where the gate electrode 932 and the insulating layer 933 are overlapped, and wirings 907 are connected to the semiconductor layer 934. In addition, the wirings 907 connected to the semiconductor layer 934 are each in contact with the insulating layer serving as a gate insulating film and the semiconductor layer.

The thin film transistor and the organic semiconductor transistor may be provided to have any structure as long as they can serve as switching elements. Note that the wirings 907 may be used as first conductive layers in a memory element of the present invention, or a memory element of the present invention may be connected to the wirings 907.

Furthermore, a transistor may be formed using a single crystalline substrate or an SOI substrate, and a memory element may be provided thereover. The SOI substrate may be formed by using a method in which a wafer is bonded or a method of forming an insulating layer 831 in an interior portion by implanting of an oxygen ion in a Si substrate, which is referred to as a SIMOX.

Figure 10C:
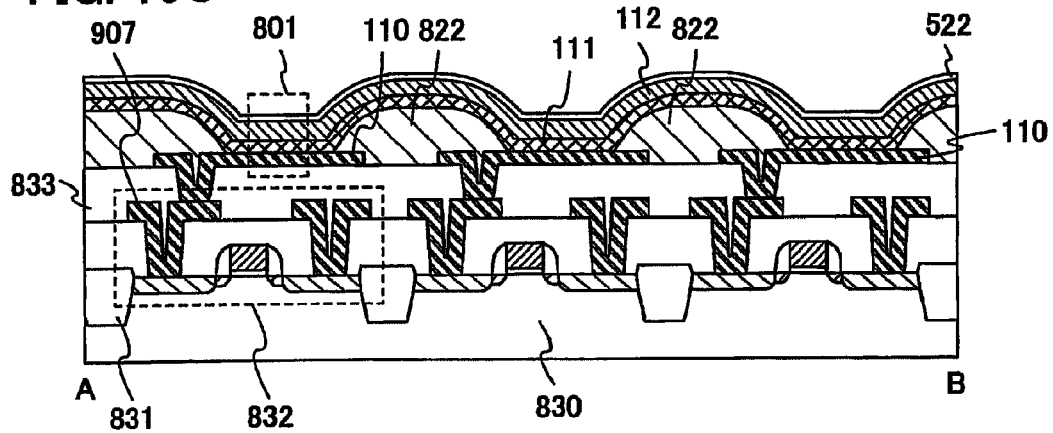

For example, when a single crystalline semiconductor is used for the substrate, as shown in FIG. 10C, a memory element 801 is connected to a field-effect transistor 832 provided using a single crystalline semiconductor substrate 830. In addition, an insulating layer 833 is provided so as to cover a wiring of the field-effect transistor 832, and the memory element 801 is provided over the insulating layer 833.

Since the transistor formed using such a single crystalline semiconductor has favorable characteristics of response speed, mobility and the like, it is possible to provide a transistor which can be operated at high speed. Further, such a transistor has slight variation in its characteristics; therefore, a highly reliable semiconductor device can be provided.

The memory element 801 is formed after the insulating layer 833 is provided so that the first conductive layer 110 can be freely arranged. In other words, the memory element has to be provided in a region outside a wiring connected to the transistor, in the structure shown in FIG. 10B. However, by provision of the insulating layer 833, it becomes possible to form the memory element 801 also above the transistor 832, for example, as shown in FIG. 10C. As a result, a memory circuit can be highly integrated. Naturally, the wiring 907 included in the field effect transistor 832 may be used as a first conductive layer included in a memory element.

Note that the memory element 801 includes the first conductive layer 110 formed over the insulating layer 833, the memory layer 111, and the second conductive layer 112. The memory layer 111 is provided between the first conductive layer 110 and the second conductive layer 112, and can be manufactured similar to that described in Embodiment Mode 1.

Figure 12:
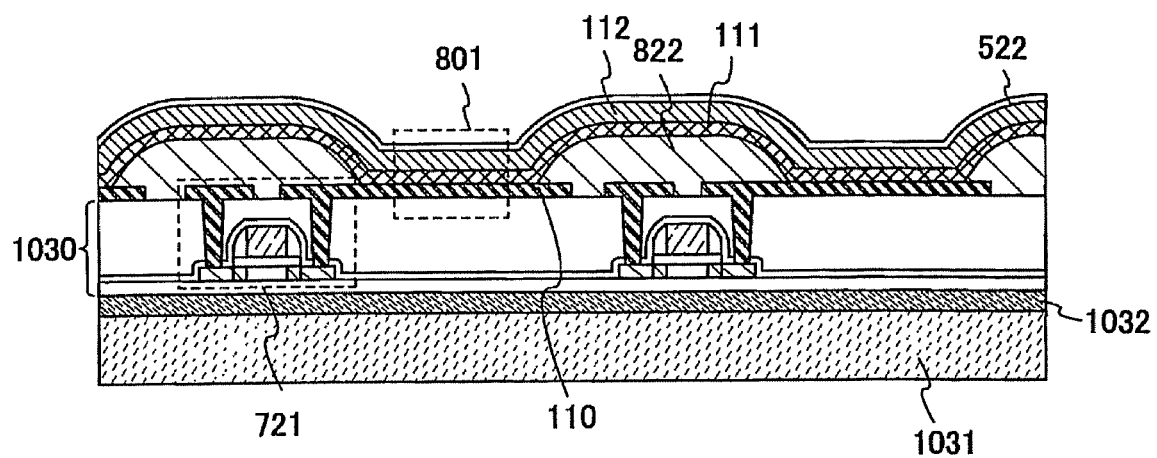
FIG. 12 is a view describing a part of a cross section of a semiconductor device of the present invention.

A separation layer is provided over a substrate and a layer 1030 having a transistor and a memory element 801 are formed over the separation layer, and then the layer 1030 having the transistor and the memory element 801 may be separated from the substrate with the use of the separation layer, and the layer 1030 having the transistor and the memory element 801 may be attached to a substrate 1031, which is different from the substrate, with the use of an adhesive layer 1032 as shown in FIG. 12. As a separation method, the following four methods and the like may be used: a first separation method where a metal oxide layer is provided as a separation layer between a substrate having high heat resistance and a layer having a transistor, and the metal oxide layer is made to be weak by crystallization so as to separate the layer having the transistor; a second separation method where an amorphous silicon film containing hydrogen is provided as a separation layer between a substrate having high heat resistance and a layer having a transistor, and the amorphous silicon film is removed by laser light irradiation or etching so as to separate the layer having the transistor; a third separation method where a substrate having high heat resistance over which a layer having a transistor is formed is mechanically removed or removed by etching with the use of a solution, a fluoride gas such as $NF_3$, a halogen fluoride gas such as $BrF_3$ or $ClF_3$; and a fourth separation method where, after a metal layer and a metal oxide layer are provided as separation layers between a substrate having high heat resistance and a layer having a transistor, the metal oxide layer is made to be weakened by crystallization, and part of the meal layer is removed by etching with the use of a solution or a fluoride gas such as $NF_3$, halogen fluoride gas such as $BrF_3$, or $ClF_3$, and then the weakened metal oxide layer is physically separated.

When a flexible substrate, a film, paper made from a fibrous material, or the like which is like the substrate 521 shown in Embodiment Mode 2 is used as the substrate 1031, a small, thin, and lightweight memory device can be realized.

Next, an operation in writing data in the memory device, that is, the semiconductor device 700 will be described with reference to FIG. 9A. As with Embodiment Mode 2, here, an operation in writing data by an electric action, typically, by voltage applied thereto will be described. Note that the data is written by change of the electrical characteristics of the memory cell. "0" and "1" refer to data in an initial state (a state where an electric action is not applied) of the memory cell and data in a state where the electrical characteristics are changed, respectively.

A case of writing data in the memory cell 701 in the x-th row and the y-th column will be described. When data "1" is written to the memory cell 701, first, the memory cell 701 is selected by the decoders 712 and 713, and the selector 714. Specifically, predetermined potential V22 is applied to the word line Wy connected to the memory cell 701 by the decoder 713. In addition, the bit line Bx connected to the memory cell 701 is connected to the reading/writing circuit 715 by the decoder 712 and the selector 714. Then, writing potential V21 is output to the bit line Bx from the reading/writing circuit 715.

The thin film transistor 721 that forms the memory cell is made in an on state in such a manner, a common electrode and the bit line are electrically connected to the memory element 722, and a voltage of approximately Vw=Vcom−V21 is applied. Vcom is a common electrode in the memory element 722, that is, potential of the second conductive layer. The voltage Vw is selected appropriately, thereby physically or electrically changing the memory layer provided between the first conductive layer and the second conductive layer; thus, the data "1" is written to the memory element. Specifically, in voltage of reading out operation, electric resistance between the first conductive layer and the second conductive layer in the state of the data "1" is preferably reduced significantly as compared to a case of being in a state of the data "0", and short circuit (short) may simply be made to occur between the first conductive layer and the second conductive layer. Note that the voltage Vw may be greater than or equal to 5 V and less than or equal to 15 V or greater than or equal to −15 V and less than or equal to −5 V, for example.

Note that non-selected word lines and non-selected bit lines are controlled so that the data "1" is not written to the memory cells which are connected. Specifically, a potential which turns off transistors of memory cells which are connected or potential which is the same level as Vcom may be applied to the non-selected word lines.

When data "0" is written to the memory cell 701, an electric action may not be applied to the memory cell 701. As for a circuit operation, for example, the memory cell 701 is selected by the decoders 712 and 713, and the selector 714 as well as the case of writing data "1"; however, the output potential from the reading/writing circuit 715 to the bit line Bx is set to be the same degree as Vcom or to be potential by which the thin film transistor 721 of the memory cell is made in an off state. As a result, low voltage (for example, −5 V to 5 V) is applied to the memory element 722 or no voltage is applied to the memory element 722; therefore, electrical characteristics of the memory element are not changed and writing of the data "0" can be realized.

Next, an operation in reading out data by an electric action will be described with reference to FIG. 9B. Data is read out by utilizing a difference in electrical characteristics of the memory elements 722, which are different between a memory cell having data "0" and another memory cell having data "1". For example, a method for reading out data by utilizing difference in electric resistance will be described under conditions where electric resistance of a memory element that includes a memory cell having the data "0" is set to be R0 at a reading voltage, and electric resistance of a memory element that includes a memory cell having the data "1" is set to be R1 at a reading voltage. Note that R1<<R0. As a structure of a readout portion of the reading/writing circuit 715, for example, a circuit using a resistance element 750 and a differential amplifier 751 which is shown in FIG. 9B can be considered. The resistance element has resistance Rr, where R1<Rr<R0. Instead of the resistance element 750, a transistor 752 may be used as shown in FIG. 9C or a clocked inverter 753 can also be used instead of the differential amplifier 751. Note that the circuit configuration is not limited to those shown in FIGS. 9B and 9C.

When data is read out from a memory cell 702 in the x-th row and the y-th column, the memory cell 702 is selected by decoders 712 and 713, and a selector 714. Specifically, predetermined potential V24 is applied to a word line Wy connected to the memory cell 702 by the decoder 713, and the thin film transistor 721 is turned on. A bit line Bx connected to the memory cell 702 is connected to a terminal P of the reading/writing circuit 715 by the decoder 712 and the selector 714. As a result, potential Vp of the terminal P becomes a value which is determined by resistance division of Vcom and V0 caused by the resistance element 750 (resistance Rr) and the memory element 722 (resistance R0 or R1). Therefore, in a case where the memory cell 702 has the data "0", potential Vp0 of the terminal P is Vp0=Vcom+(V0−Vcom)×R0/(R0+Rr). When the memory cell 702 has the data "1", potential Vp1 of the terminal P is Vp1=Vcom+(V0−Vcom)×R1/(R1+Rr). As a result, by selecting Vref to be between Vp0 and Vp1 in FIG. 9B and selecting a change point of the clocked inverter to be between Vp0 and Vp1 in FIG. 9C, Low/High (or High/Low) of an output potential Vout is output in accordance with the data "0" or data "1", and the data can be read out.

For example, it is assumed that the differential amplifier 751 is operated at Vdd=3 V, and Vcom is set to be 0 V; V0, 3 V; and Vref, 1.5 V. If R0/Rr=Rr/R1=9 and on-resistance of the thin film transistor 721 can be ignored, in a case where a memory cell has the data "0", Vp0 becomes 2.7 V and High is output as Vout. Meanwhile, in a case where a memory cell has the data "1", Vp1 becomes 0.3 V and Low is output as Vout. In such a manner, readout of memory cells can be performed.

According to the above method, data is read out by a voltage value with the use of a difference in resistance of the memory elements 722 and resistance division. Of course, the method for reading out data is not limited to this method. For example, data may be read out by utilizing a difference in a current value besides utilization of difference in electronic resistance. Moreover, data may also be read out by utilizing difference in threshold voltage when the electrical characteristics of the memory cells have diode characteristics which are different in threshold voltage between a memory cell having data "0" and another memory cell having data "1".

In addition, a thin film transistor (TFT) may be provided over a substrate having an insulating property, and the memory element or a memory element array may be provided thereover. Alternatively, instead of the substrate having an insulating property, a semiconductor substrate such as a Si substrate or an SOI substrate may be used to form a field-effect transistor (FET) over the substrate, and the memory element or a memory element array may be provided thereover.

Regarding the semiconductor device shown in this embodiment mode, data can be written not only once but can also be written additionally. Since data once written to the memory element cannot be erased, it is possible to prevent forgery by rewriting. Further, since the semiconductor device includes the memory element of the present invention, which can be simply manufactured with high yield, a semiconductor device with excellent performance and reliability can be manufactured at low cost.

Note that this embodiment mode can be combined with any of the other embodiment modes as appropriate. Therefore, in the memory element included in the semiconductor device shown in this embodiment mode, for example, an insulating layer or a semiconductor layer may be provided between the first conductive layer and the memory layer.

Embodiment Mode 4

This embodiment mode will describe a structural example of a semiconductor device having the memory device which is shown in the above embodiment modes, with reference to the drawings.

One feature of the semiconductor device shown in this embodiment mode is that data can be read out from and written to the semiconductor device without contact. Data transmitting types can be largely classified into three of an electromagnetic coupling type in which a pair of coils is placed to face each other and communication is performed by mutual induction; an electromagnetic induction type in which communication is performed by an induction field; and a radio wave type in which communication is performed by utilizing radio waves, and any type may be employed. Moreover, there are two types of layouts of an antenna used for transmitting data: one is a case where an antenna is provided over a substrate over which a transistor and a memory element are provided; and the other is a case where a terminal portion is provided over a substrate over which a transistor and a memory element are provided and an antenna, which is provided over the other substrate, is connected to the terminal portion.

Figure 13A:
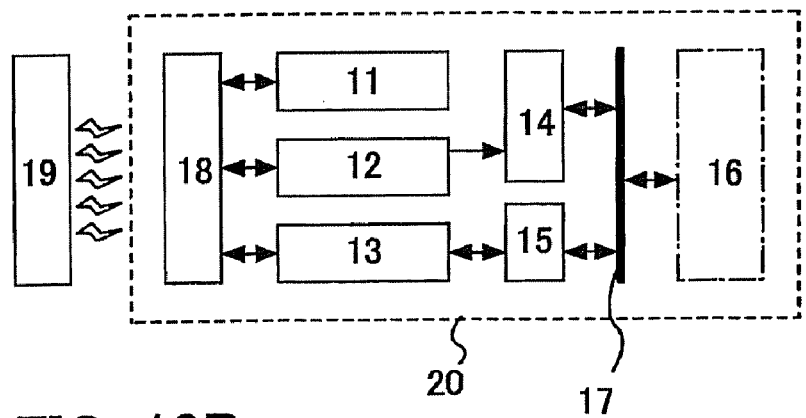
FIGS. 13A to 13C are views each describing a structural example of a semiconductor device of the present invention.

Structures of semiconductor devices shown in this embodiment mode will be described with reference to FIGS. 13A to 13C. As shown in FIG. 13A, a semiconductor device 20 of the present invention has a function of receiving/sending data without contact, and includes a power supply circuit 11, a clock generation circuit 12, a data demodulation/modulation circuit 13, a control circuit 14 controlling other circuits, an interface circuit 15, a memory circuit 16, a bus 17, and an antenna 18.

Figure 13B:
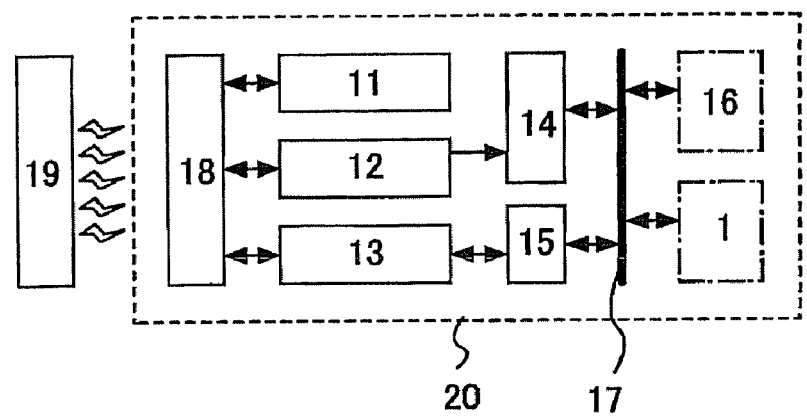

In addition, as shown in FIG. 13B, the semiconductor device 20 of the present invention has a function of receiving/sending data without contact, and may include a central processing unit 1, in addition to the power supply circuit 11, the clock generation circuit 12, the data demodulation/modulation circuit 13, the control circuit 14 controlling other circuits, the interface circuit 15, the memory circuit 16, the bus 17, and the antenna 18.

Figure 13C:
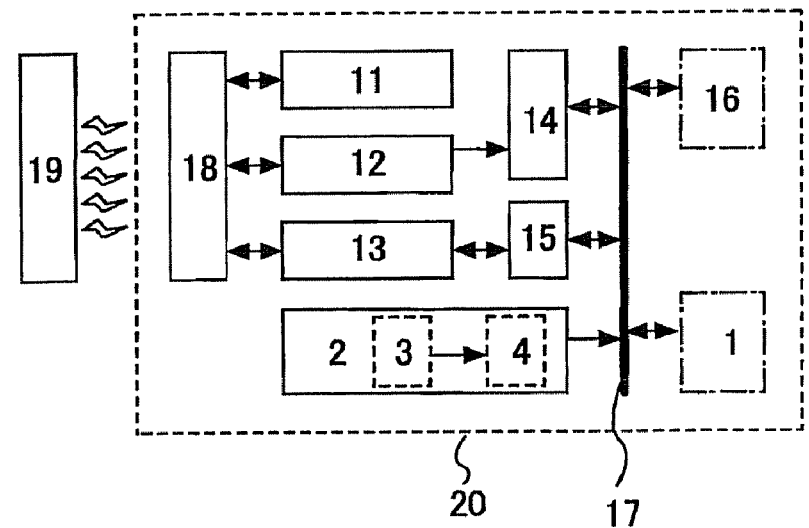

As shown in FIG. 13C, the semiconductor device 20 of the present invention has a function of receiving/sending data without contact, and may include a detecting portion 2 including a detecting element 3 and a detection circuit 4, in addition to the power supply circuit 11, the clock generation circuit 12, the data demodulation/modulation circuit 13, the control circuit 14 controlling other circuits, the interface circuit 15, the memory circuit 16, the bus 17, the antenna 18, and the central processing unit 1.

The power supply circuit 11 generates various kinds of power sources to be supplied to each circuit inside of the semiconductor device 20 based on alternating current signals input from the antenna 18. The clock generation circuit 12 generates various clock signals to be supplied to each circuit inside of the semiconductor device 20 based on alternating current signals input from the antenna 18. The data demodulation/modulation circuit 13 has a function of demodulating/modulating data for communicating with a reader/writer 19. The control circuit 14 has a function of controlling the memory circuit 16. The antenna 18 has a function of sending and receiving electromagnetic waves or radio waves. The reader/writer 19 controls communication with the semiconductor device and processing of data thereof. Note that the semiconductor device is not limited to the above structures. For example, the semiconductor device may further include other elements such as a limiter circuit of power voltage and hardware for encryption processing.

The memory circuit 16 includes one or a plurality of memory elements selected from the memory elements shown in Embodiment Mode 1. With the use of a memory element of the present invention, a memory circuit can be manufactured simply with high yield.

Moreover, data can be written in the memory element not only once but can also be written additionally. On the other hand, since it is impossible to erase data of a memory element where writing is once performed, it is possible to prevent forgery by rewriting. Accordingly, a semiconductor device with high performance and reliability can be manufactured at low cost.

The detecting portion 2 can detect temperature, pressure, flow rate, light, magnetism, sonic waves, acceleration, humidity, a gas component, a fluid component, and other characteristics by physical means or chemical means. The detecting portion 2 includes the detecting element 3 for detecting a physical quantity or a chemical quantity and the detection circuit 4, which converts a physical quantity or a chemical quantity detected by the detecting element 3 into a suitable signal such as an electrical signal. The detecting element 3 can be formed using a resistance element, a capacitance coupled element, an inductively coupled element, a photovoltaic element, a photoelectric conversion element, a thermovoltaic element, a transistor, a thermistor, a diode, or the like. Note that a plurality of detecting portions 2 may be provided. In this case, a plurality of physical quantities or chemical quantities can be detected simultaneously.

The physical quantities mentioned here indicate temperature, pressure, flow rate, light, magnetism, sonic waves, acceleration, humidity, and the like. The chemical quantities mentioned here indicate chemical substances and the like such as a gas component like a gas and a fluid component like an ion. In addition to the above, the chemical quantities further include an organic compound like a particular biological substance contained in blood, sweat, urine, and the like (for example, a blood-sugar level contained in blood). In particular, in order to detect a chemical quantity, a certain substance is inevitably detected selectively; therefore, a substance to be detected and a substance which is selectively reacted are provided in advance in the detecting element 3. For example, when detecting a biological substance, enzyme, an antibody, a microbial cell, and the like, which are selectively reacted with the biological substance to be detected by the detecting element 3, are preferably immobilized to a high molecule and the like.

Figure 14A:
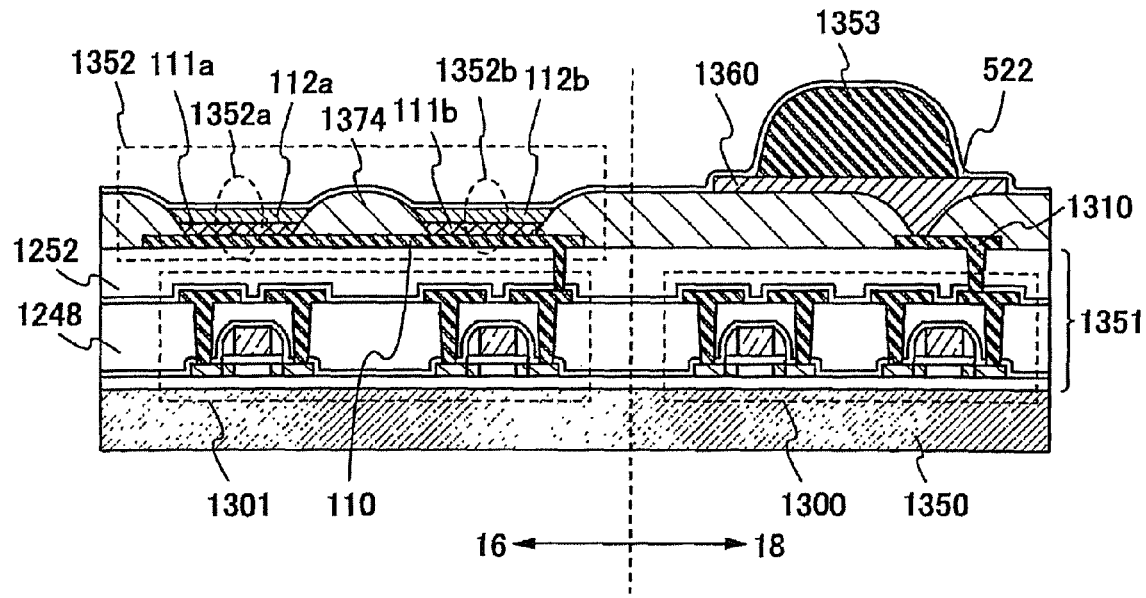
FIGS. 14A and 14B are views each describing a part of a cross section of a semiconductor device of the present invention.
Figure 14B:
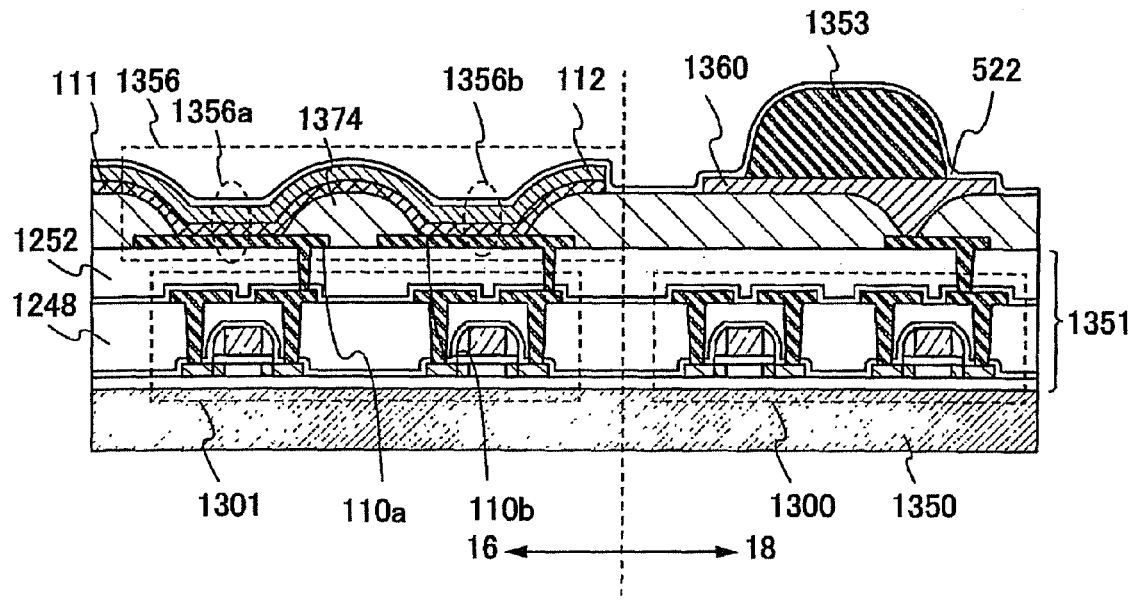

Next, FIGS. 14A and 14B show an example of a structure of a semiconductor device provided with an antenna over a substrate provided with a plurality of elements and memory elements. Note that FIGS. 14A and 14B are partial cross-sectional views of the memory circuit 16 and the antenna 18.

FIG. 14A illustrates a semiconductor device having a passive matrix type memory circuit. Over a substrate 1350, the semiconductor device includes a layer 1351 having transistors 1300 and 1301, a memory element portion 1352 formed over the layer 1351 having the transistors, and a conductive layer 1353 serving as an antenna.

Note that a case is shown in which the semiconductor device includes the memory element portion 1352 and the conductive layer 1353 serving as an antenna over the layer 1351 having the transistors; however, the present invention is not limited to this structure. The memory element portion 1352 or the conductive layer 1353 serving as an antenna may be provided below or in the same layer as the layer 1351 having the transistors.

The memory element portion 1352 has a plurality of memory elements 1352a and 1352b. The memory element 1352a includes a first conductive layer 110 provided over an insulating layer 1252, a memory layer 111a provided over the first conductive layer 110, and a second conductive layer 112a. Further, the memory element 1352b includes the first conductive layer 110 provided over the insulating layer 1252, a memory layer 111b provided over the first conductive layer 110, and a second conductive layer 112b. Note that the memory elements 1352a and 1352b are separated from each other by a partition wall (insulating layer) 1374.

The first conductive layer 110 in the memory element portion 1352 is connected to a wiring of the transistor 1301. The memory element portion 1352 can be formed using a material and a manufacturing method similar to those of the memory element shown in the above embodiment modes. Further, an insulating layer 522 is formed, which serves as a protective film so as to cover the second conductive layers 112a and 112b and the conductive layer 1353 serving as an antenna.

Note that the conductive layer 1353 serving as an antenna is provided over the conductive layer 1360. The conductive layer 1360 may be formed after formation of the partition wall (insulating layer) 1374, and is connected to the transistor 1300 through a wiring 1310 formed in the same process as the first conductive layer 110 in the memory element portion 1352

The conductive layer 1353 serving as an antenna is formed using a conductive material by a CVD method, a sputtering method, a printing method such as screen printing or gravure printing, a droplet discharging method, a dispenser method, a plating method, or the like. As the conductive material, an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing these elements as its main component is used to form the conductive layer 1353 using a single-layer or stacked-layer structure.

When the conductive layer serving as an antenna is formed using a screen printing method, for example, a conductive paste where conductive particles each having a grain size of several nm to several tens of μm, are dissolved or dispersed in an organic resin is selectively printed in a desired region so that the conductive layer serving as an antenna can be provided. As a conductive particle, a metal particle of any one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersive nanoparticles can be used. In addition, as the organic resin included in the conductive paste, one or a plurality of organic resins each serving as a binder, a solvent, a dispersant, or a coating member of the metal particle can be used. Typically, an organic resin such as an epoxy resin or a silicone resin can be used. When forming the conductive layer, baking is preferably performed after the conductive paste is pushed out. For example, when fine particles (for example, the grain size of greater than or equal to 1 nm and less than or equal to 100 nm) containing silver as its main component are used as a material of the conductive paste, the conductive layer can be obtained by being cured by baking at temperatures of 150° C. to 300° C. Alternatively, fine particles containing solder or lead-free solder as its main component may be used. In this case, it is preferable to use fine particles each having a grain size of less than or equal to 20 μm. Solder or lead-free solder has an advantage of low cost. Moreover, besides the above materials, ceramic, ferrite, or the like may be applied for the antenna.

The transistors shown in Embodiment Mode 3 or the like can be selected appropriately and used for the transistors 1300 and 1301 included in the layer 1351 having the transistors.

Moreover, a separation layer is provided over the substrate; the layer 1351 having the transistors, the memory element portion 1352, and the conductive layer 1353 serving as an antenna are formed over the separation layer; and the layer 1351 having the transistors, the memory element portion 1352, and the conductive layer 1353 serving as an antenna are appropriately separated using the separation method shown in Embodiment Mode 3, which may be attached over a substrate with the use of an adhesive layer. As the substrate, a flexible substrate, a film, paper made of a fibrous material, a base film, or the like which is shown as the substrate 521 in Embodiment Mode 2 is used, so that it is possible to achieve reduction in size, thickness and weight of a memory device.

FIG. 14B shows an example of a semiconductor device having an active matrix type memory circuit. Note that portions in FIG. 14B which are different from those in FIG. 14A will be described.

Over a substrate 1350, the semiconductor device shown in FIG. 14B includes a layer 1351 having transistors 1300 and 1301, a memory element portion 1356 and a conductive layer 1353 serving as an antenna above the layer 1351 having the transistors. Note that a case where the memory element portion 1356 and the conductive layer 1353 serving as an antenna are formed above the layer 1351 having the transistors; however, the present invention is not limited to this structure. The memory element portion 1356 and the conductive layer 1353 serving as an antenna may be formed above or below the layer 1351 having the transistor 1301 or can be formed below or in the same layer as the layer 1351 having the transistors.

The memory element portion 1356 includes memory elements 1356a and 1356b. A memory element 1356a includes a first conductive layer 110a formed over an insulating layer 1252, a memory layer 111 and a second conductive layer 112 provided over the first conductive layer 110a. A memory element 1356b includes a first conductive layer 110b formed over an insulating layer 1252, the memory layer 111 and the second conductive layer 112 provided over the first conductive layer 110b. Note that the memory elements 1356a and 1356b are separated from each other by a partition wall (insulating layer) 1374, and the memory element portion 1356 may be formed using the same material and manufacturing method as those of the memory element shown in the above embodiment mode. Further, a wiring of a transistor is connected to each of first conductive layers including a memory element. Specifically, memory elements are each connected to one of transistors.

A separation layer is provided over the substrate; the layer 1351 having the transistors, the memory element portion 1356, and the conductive layer 1353 serving as an antenna are formed over the separation layer; and the layer 1351 having the transistors, the memory element portion 1356, and the conductive layer 1353 serving as an antenna are appropriately separated using the separation method shown in Embodiment Mode 3, which may be attached over a substrate with the use of an adhesive layer.

Next, a structural example of a semiconductor device including a first substrate having a layer having transistors, a terminal portion being connected to the antenna, and a memory element, and a second substrate over which an antenna being connected to the terminal portion is formed will be explained with reference to FIGS. 15A and 15B. Note that portions in FIGS. 15A and 15B which are different from those in FIGS. 14A and 14B will be described.

Figure 15A:
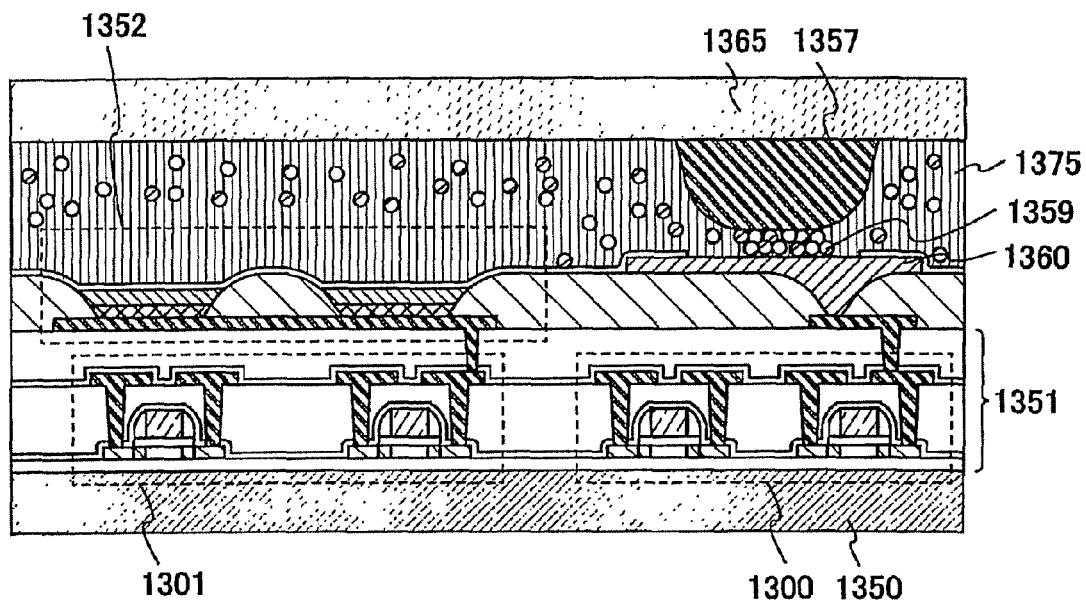
FIGS. 15A and 15B are views each describing a part of a cross section of a semiconductor device of the present invention.

FIG. 15A shows a semiconductor device having a passive matrix type memory device. The semiconductor device includes a layer 1351 having transistors 1300 and 1301, a memory element portion 1352 formed above the layer 1351 having the transistors, a terminal portion connected to an antenna, and a substrate 1365 over which a conductive layer 1357 serving as an antenna is formed, which are formed over a substrate 1350; and the conductive layer 1357 and a conductive layer 1360 to be a connection terminal are electrically connected to each other by conductive particles 1359 contained in a resin 1375. Note that the substrate 1350 including the layer 1351 having the transistors, the memory element portion 1352, and the like and the substrate 1365 provided with the conductive layer 1357 serving as an antenna are attached to each other using the resin 1375 having an adhesive property.

Alternatively, the conductive layer 1357 serving as an antenna and the conductive layer 1360 to be a connection terminal may be connected to each other using a conductive adhesive agent such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1352 may be provided below or in the same layer as the layer 1351 having the transistors.

Figure 15B:
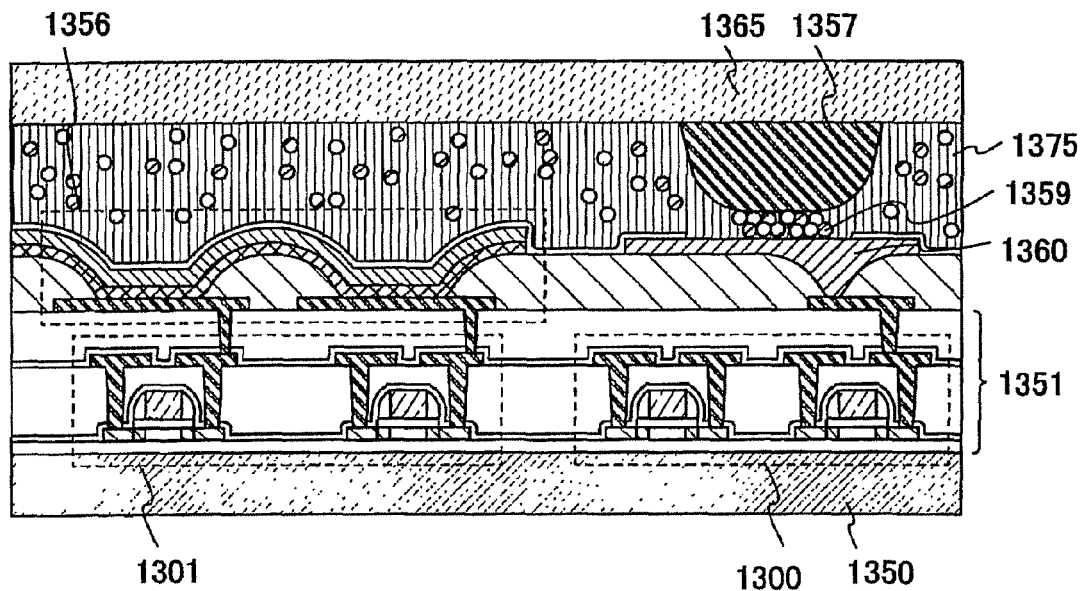

FIG. 15B shows a semiconductor device having an active matrix type memory device. The semiconductor device includes a layer 1351 having transistors 1300 and 1301, a memory element portion 1356 formed above the layer 1351 having the transistors, a terminal portion connected to the transistors, and a substrate 1365 over which a conductive layer 1357 serving as an antenna is formed, which are formed over a substrate 1350; and the conductive layer 1357 and a conductive layer 1360 to be a connection terminal are connected to each other by conductive particles 1359 contained in a resin 1375. Note that the substrate 1350 including the layer 1351 having the transistors, the memory element portion 1356, and the like and the substrate 1365 provided with the conductive layer 1357 serving as an antenna are attached to each other using the resin 1375 having an adhesive property.

Alternatively, the substrate 1350 including the layer 1351 having the transistors, the memory element portion 1356, and the like and the substrate 1365 provided with the conductive layer 1357 serving as an antenna may be attached to each other using a conductive adhesive agent such as a silver paste, a copper paste, and a carbon paste or a solder joint method. Note that a case in which the memory element portion 1352 is provided above the layer 1351 having the transistors is shown here; however, the present invention is not limited to this structure. The memory element portion 1356 may be provided below or in the same layer as the layer 1351 having the transistors.

A separation layer is formed over the substrate; the layer 1351 having the transistors and the memory element portion 1352 or 1356 are formed over the separation layer; and the layer 1351 having the transistors and the memory element portions 1352 and 1356 are appropriately separated using the separation method shown in Embodiment Mode 3, which may be attached over a substrate with the use of an adhesive layer.

The substrate 1365 which is provided with the conductive layer 1357 serving as an antenna may be provided with each of the memory element portions 1352 and 1356. In other words, a first substrate, over which a layer having transistors is provided, and a second substrate, which is provided with a memory element portion and a conductive layer serving as an antenna are provided, may be attached to each other with the use of a resin containing conductive particles. A sensor being connected to the transistors may also be provided as well as the semiconductor devices shown in FIGS. 14A and 14B.

Regarding the semiconductor device shown in this embodiment mode, data can be written to the semiconductor device not only once but can also be written additionally. Since data once written to a memory element cannot be erased, it is possible to prevent forgery by rewriting. Further, since the semiconductor device includes a memory element of the present invention, which can be manufactured simply with high yield, a semiconductor device with excellent performance and reliability can be manufactured at low cost.

Note that this embodiment mode can be combined with any of the other embodiment modes and embodiments as appropriate. Therefore, in a memory element included in the semiconductor device shown in this embodiment mode, for example, an insulating layer or a semiconductor layer may be provided between the first conductive layer and the memory layer.

Embodiment Mode 5

Figure 16A:
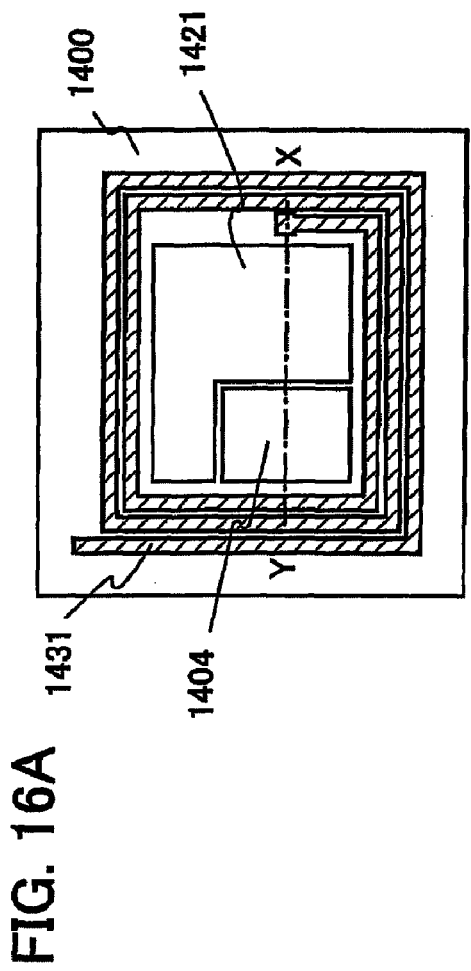
FIGS. 16A and 16B are views describing a semiconductor device of the present invention.
Figure 16B:
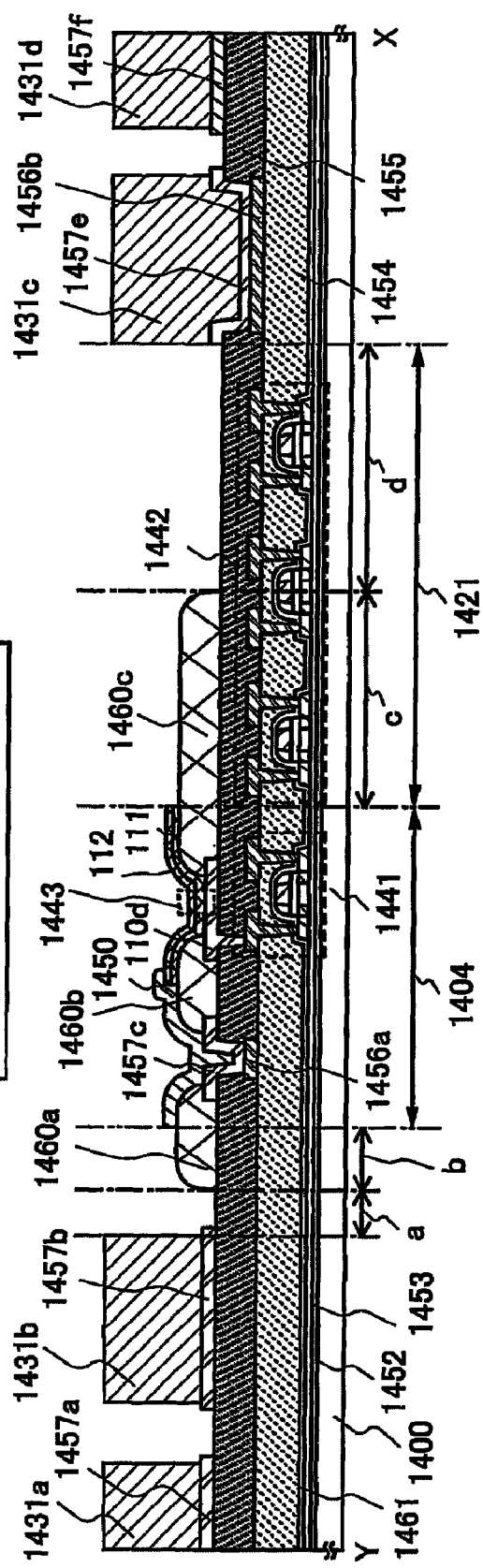
Figure 17A:
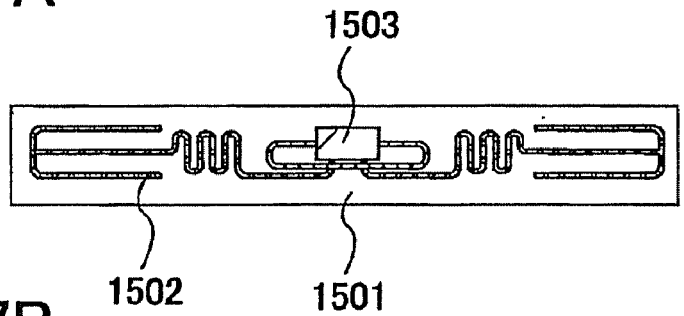
FIGS. 17A to 17D are views describing a chip-like semiconductor device of the present invention.
Figure 17B:
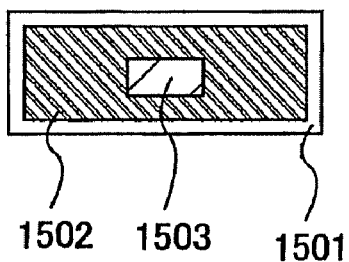
Figure 17C:
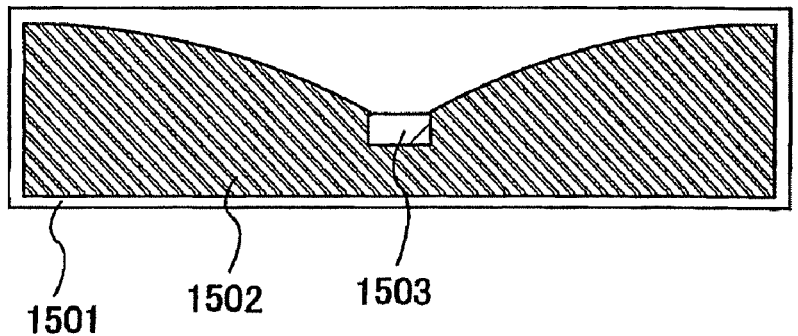
Figure 17D:
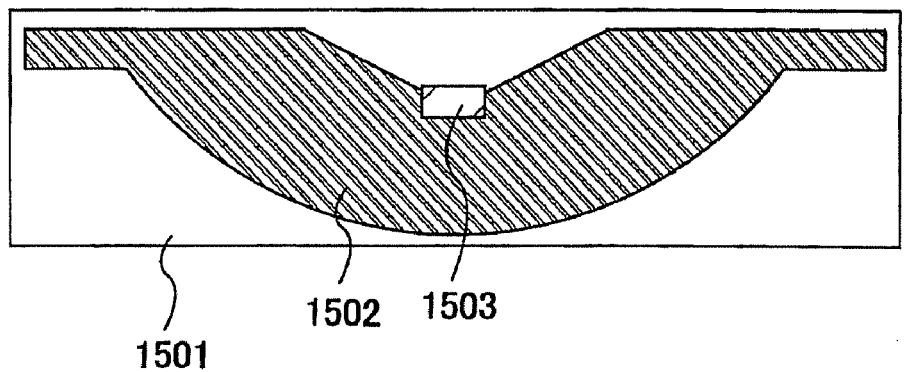

This embodiment mode will explain an example of a semiconductor device having the memory element of the present invention with reference to the drawings. FIG. 16A shows a top view of the semiconductor device of this embodiment mode, and FIG. 16B shows a cross-sectional view taken along line X-Y in FIG. 16A.

As shown in FIG. 16A, a memory element portion 1404 having a memory element, a circuit portion 1421, and an antenna 1431 are formed over a substrate 1400. States shown in FIGS. 16A and 16B are in the middle of a manufacturing process, in which the memory element portion, the circuit portion, and the antenna have been formed over the substrate 1400 capable of resisting the manufacturing condition. The material and manufacturing process may appropriately be selected in a manner similar to the above embodiment modes for manufacturing.

Over the substrate 1400, a transistor 1441 is provided in the memory element portion 1404 while a transistor 1442 is provided in the circuit portion 1421, with a separation layer 1452 and an insulating layer 1453 interposed therebetween. Insulating layers 1461, 1454, and 1455 are formed over the transistors 1441 and 1442, and a memory element 1443 is formed over the insulating layer 1455.

The memory element 1443 includes a first conductive layer 110d, a memory layer 111, and a second conductive layer 112, which are provided over the insulating layer 1455. The memory layer 111 is provided between the first conductive layer 110d and the second conductive layer 112. Note that the memory element 1443 can be formed using the same material or the same manufacturing method as those of the memory element shown in the above embodiment mode. Although omitted in FIGS. 16A and 16B, a plurality of the memory elements 1443 are separated from each other by insulating layers 1460b serving as partition walls.

The first conductive layer 110d is connected to a wiring layer of the transistor 1441. On the other hand, the second conductive layer 112 is connected to a conductive layer 1457c stacked on a wiring layer 1456a through a wiring 1450. In addition, a conductive layer and an antenna 1431 shown in FIG. 16A are provided over the insulating layer 1455 by being stacked together. In FIG. 16B, the conductive layer corresponds to conductive layers 1457a, 1457b, 1457e, and 1457f, and the conductive layers 1457a, 1457b, and 1457f are stacked with antennas 1431a, 1431b, and 1431d, respectively. Note that the conductive layer 1457e and an antenna 1431c are each formed in an opening portion that reaches a wiring layer 1456b which is formed in the insulating layer 1455, and the conductive layer 1457e and the wiring layer 1456b are connected to each other. In such a manner, the antennas are electrically connected to the memory element portion 1404 and the circuit portion 1421. In addition, the conductive layers 1457a, 1457b, 1457e, and 1457f formed under the antennas 1431a, 1431b, 1431c, and 1431d, respectively, also have an effect of improving adhesiveness between the insulating layer 1455 and the antennas. In this embodiment mode, a polyimide film is used for the insulating layer 1455, a titanium film is used for each of the conductive layers 1457a, 1457b, 1457e, and 1457f, and an aluminum film is used for each of the antennas 1431a, 1431b, 1431c, and 1431d.

Openings (also referred to as contact holes) are formed in the insulating layer 1455 so that the first conductive layer 110d and the transistor 1441, the conductive layer 1457c and the wiring layer 1456a, and the conductive layer 1457e and the wiring layer 1456b are connected to each other. Since resistance is decreased as the contact area between conductive layers are increased by enlargement of the opening, the openings are set in this embodiment mode so that the opening for connecting the first conductive layer 110d to the transistor 1441 is the smallest, the opening for connecting the conductive layer 1457c to the wiring layer 1456a is followed, and the opening for connecting the conductive layer 1457e to the wiring layer 1456b is the largest. In this embodiment mode, the opening for connecting the first conductive layer 110d to the transistor 1441 is 5 μm×5 μm, the opening for connecting the conductive layer 1457c to the wiring layer 1456a is 50 μm×50 μm, and the opening for connecting the conductive layer 1457e to the wiring layer 1456b is 500 μm×500 μm.

In this embodiment mode, distance a from an insulating layer 1460a to the antenna 1431b is greater than or equal to 500 μm, distance b from the end portion of the wiring 1450 connected to the second conductive layer 112 to the end portion of the insulating layer 1460a is greater than or equal to 250 μm, distance c from the end portion of the second conductive layer 112 to an end portion of an insulating layer 1460c is greater than or equal to 500 μm, and distance d from the end portion of the insulating layer 1460c to the antenna 1431c is greater than or equal to 250 μm. The insulating layer 1460c is formed partially in the circuit portion 1421; thus, one part of the transistor 1442 is covered with the insulating layer 1460c and the other part thereof is not covered with the insulating layer 1460c.

With the use of such a semiconductor device, a power supply voltage or a signal is directly input to the memory element portion 1404 from an external input portion so that data (corresponding to information) can be written to the memory element portion 1404 or read out from the memory element portion 1404.

Moreover, the antenna may be provided either so as to overlap the memory element portion or so as to surround the memory element portion without the memory element portion being overlapped. When the memory element portion overlaps, the antenna may overlap the memory element portion either entirely or partially. For example, a structure where an antenna portion and a memory element portion are overlapped each other can reduce a defective operation of a semiconductor device caused by noise superposed on a signal when communication is performed by the antenna, or fluctuation or the like of electromotive force generated by electromagnetic induction.

As a signal transmission system in the above semiconductor device capable of transmitting and receiving data in a non-contact manner, an electromagnetic coupling system, an electromagnetic induction system, a microwave system, or the like can be used. The transmission system can be appropriately selected in consideration of an intended use, and an optimum antenna may be provided in accordance with the transmission system.

FIGS. 17A to 17D each show an example of a chip-like semiconductor device including a conductive layer 1502 serving as an antenna and a memory element portion 1503 which are formed over a substrate 1501. Note that an integrated circuit or the like in addition to the memory element may be mounted on the semiconductor device.

When a microwave system (for example, an UHF band (a 860 to 960 MHz band), a 2.45 GHz band, or the like) is applied as the signal transmission system in the semiconductor device, the shape such as the length of the conductive layer serving as an antenna may be appropriately set in consideration of the wavelength of an electromagnetic wave used for signal transmission. For example, the conductive layer serving as an antenna can be formed in a linear shape (for example, a dipole antenna (see FIG. 17A)), a flat shape (for example, a patch antenna (see FIG. 17B)), a ribbon shape (see FIGS. 17C and 17D), or the like. The shape of the conductive layer serving as an antenna is not limited to the form of a line; however, the conductive layer serving as an antenna may also be provided in the form of a curve, a meander, or a combination of them, in consideration of the wavelength of the electromagnetic wave.

In addition, when an electromagnetic coupling system or an electromagnetic induction system (for example, a 13.56 MHz band) is applied as the signal transmission system in the semiconductor device, electromagnetic induction caused by change in magnetic field density is utilized; therefore, a conductive layer serving as an antenna is preferably formed in an annular shape (for example, a loop antenna) or a spiral shape (for example, a spiral antenna).

In addition, even when an electromagnetic coupling system or an electromagnetic induction system is applied and a semiconductor device having an antenna is provided in contact with metal, a magnetic material having magnetic permeability is preferably provided between the semiconductor device and the metal. When a semiconductor device having an antenna is provided in contact with metal, eddy current flows through the metal in accordance with change in magnetic field, and a demagnetizing field generated by the eddy current impairs the change in magnetic field to reduce the communication distance. Therefore, by a material having magnetic permeability being provided between the semiconductor device and the metal, eddy current of the metal can be suppressed; thus, reduction in communication distance can be suppressed. Note that ferrite or a metal thin film having high magnetic permeability and little loss of high frequency wave can be used as the magnetic material.

Moreover, when providing an antenna, a semiconductor element such as a transistor and a conductive layer serving as an antenna may be directly formed on one substrate, or alternatively, a semiconductor element and a conductive layer serving as an antenna may be separately provided over different substrates and then attached to be electrically connected to each other.

Regarding the semiconductor device shown in this embodiment mode, data can be written to the semiconductor device not only once but can also be written additionally. Since data once written to a memory element cannot be erased, it is possible to prevent forgery by rewriting. Further, since the semiconductor device includes a memory element of the present invention, which can be manufactured simply with high yield, a semiconductor device with excellent performance and reliability can be manufactured at low cost.

Note that this embodiment mode can be combined with any of the other embodiment modes and embodiments as appropriate. For example, in a memory element included in the semiconductor device shown in this embodiment mode, an insulating layer or a semiconductor layer may be provided between a first conductive layer and a memory element.

Embodiment Mode 6

Figure 18A:
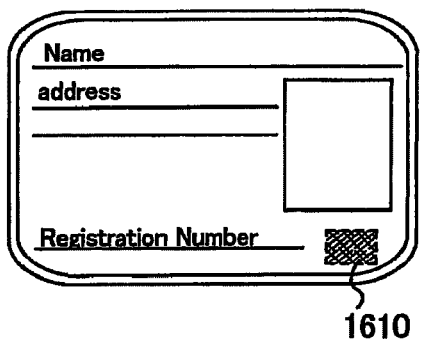
FIGS. 18A to 18F are views each describing an article mounted with a semiconductor device of the present invention.
Figure 18B:
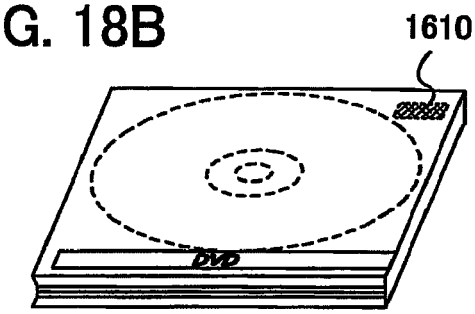
Figure 18C:
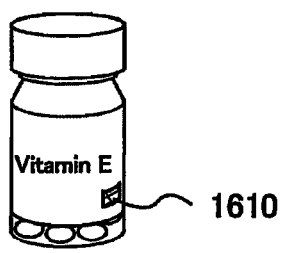
Figure 18D:
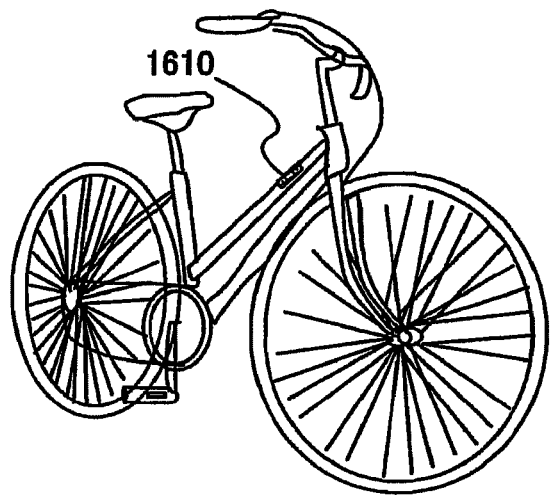
Figure 18E:
Figure 18F:
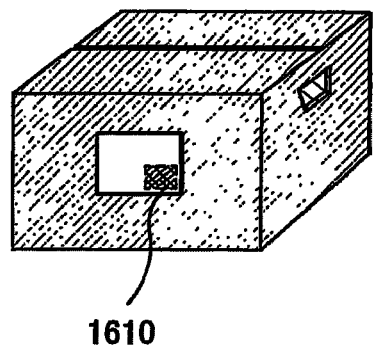

According to the present invention, a semiconductor device serving as a wireless chip can be formed. Although a wireless chip can be used broadly, it may be used by being mounted in products such as, bills, coins, securities, bearer bonds, certificates (driver's licenses, resident cards, or the like, see FIG. 18A), containers for wrapping objects (wrapping paper, bottles, or the like, see FIG. 18C), recording media (DVDs, video tapes, or the like, see FIG. 18B), vehicles (bicycles or the like, see FIG. 18D), products such as personal belongings (bags, glasses, or the like), foods, plants, animals, human bodies, clothes, livingware, or electronic devices, or objects such as shipping tags of baggage (see FIGS. 18E and 18F). The electronic device indicates a liquid crystal display device, an EL display device, a television device (also simply referred to as a TV, a TV receiver, or a television receiver), a cellular phone, and the like.

A semiconductor device 1610 of the present invention, having a memory element of the present invention, is mounted on a printed substrate, attached to a surface, or incorporated to be fixed in an object. For example, the semiconductor device is incorporated in paper of a book or an organic resin of a package to be fixed in each object. As for the semiconductor device 1610 of the present invention, a small size, a thin shape, and lightweight are achieved and an attractive design of the object itself is not damaged even after being fixed in the object. In addition, by the semiconductor device 1610 of the present invention being provided in bills, coins, securities, bearer bonds, certificates, or the like, a certification function can be obtained and forgery thereof can be prevented by the use of the certification function. Further, by the semiconductor device 1610 of the present invention being provided in containers for wrapping objects, recording media, personal belongings, foods, clothes, livingware, electronic devices, or the like, a system such as an inspection system can be performed efficiently.

Figure 19:
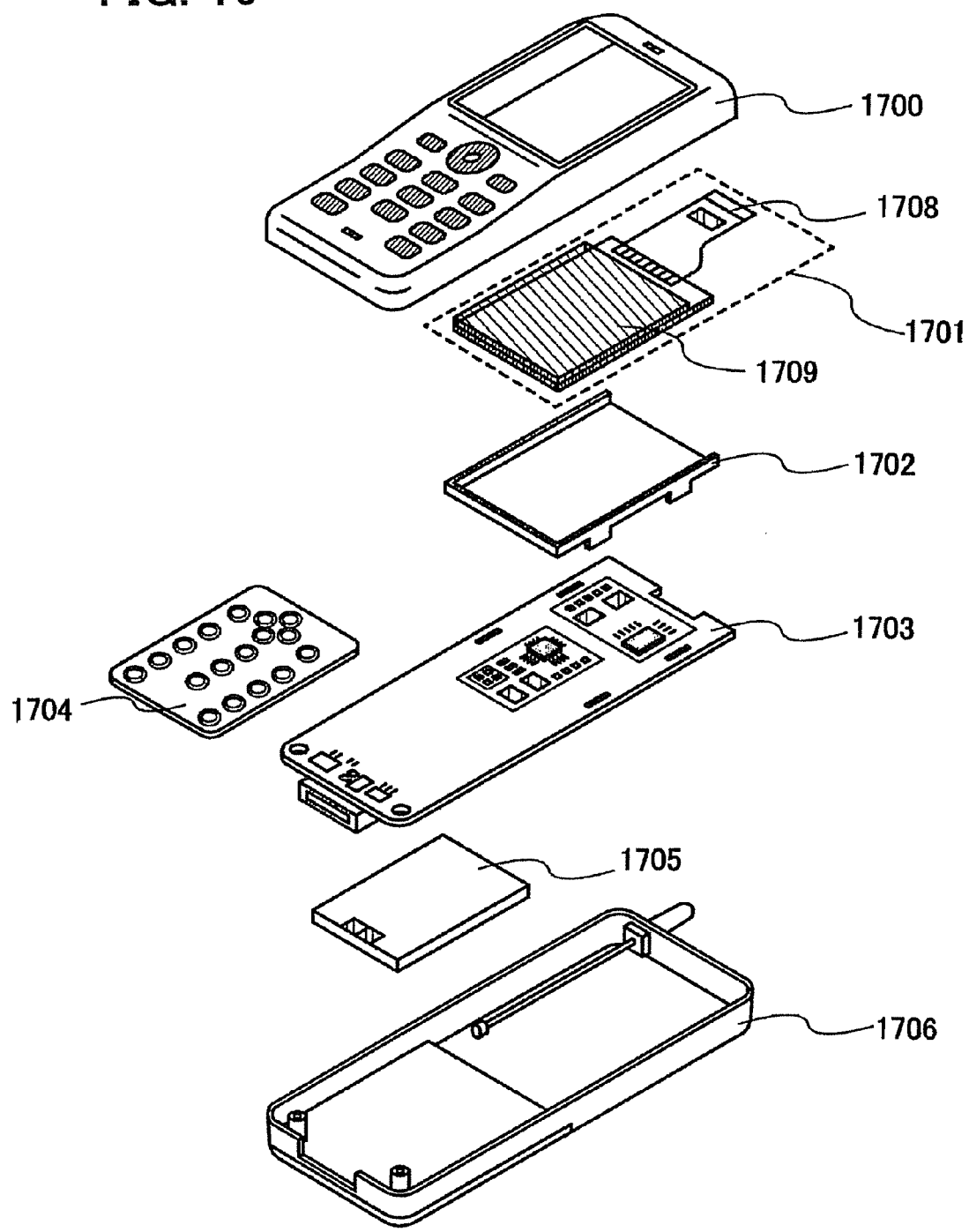
FIG. 19 is a view describing a cellular phone mounted with a semiconductor device of the present invention.

Next, one mode of the electronic devices on which the semiconductor device of the present invention is mounted will be described with reference to FIG. 19. The electronic device exemplified here is a cellular phone, which includes chassis 1700 and 1706, a panel 1701, a housing 1702, a printed wiring board 1703, operation buttons 1704, and a battery 1705. The panel 1701 is incorporated in the housing 1702 to be detachable, and the housing 1702 is fitted to the printed wiring board 1703. As for the housing 1702, a shape and a size thereof are appropriately changed depending on an electronic device in which the panel 1701 is incorporated. A plurality of semiconductor devices which are packaged are mounted on the printed wiring board 1703, and as one of the semiconductor devices, the semiconductor device having the memory element of the present invention can be used. A plurality of semiconductor devices mounted on the printed wiring board 1703 have any function of a controller, a central processing unit (CPU), a memory, a power supply circuit, an audio processing circuit, a transmitter/receiver circuit, and the like.

The panel 1701 is connected to the printed wiring board 1703 through a connection film 1708. The panel 1701, the housing 1702, and the printed wiring board 1703 are stored in the chassis 1700 and 1706 with the operation buttons 1704 and the battery 1705. A pixel region 1709 included in the panel 1701 is disposed so as to be visually recognized by an opening window provided in the chassis 1700.

As described above, the semiconductor device of the present invention has features of a small size, a thin shape, and lightweight. According to these features, limited space inside the chassis 1700 and 1706 of the electronic device can be used efficiently. Note that the chassis 1700 and 1706 are shown as one example of an appearance shape of a cellular phone, and the electronic device according to this embodiment can be changed to various modes in accordance with a function or an application thereof.

Note that a memory element of the present invention includes a first conductive layer, a memory layer, and a second conductive layer, and the memory layer is provided between the first conductive layer and the second conductive layer. Note that the memory layer and the second conductive layer 512 can be manufactured in the same process by performing pretreatment and baking to nanoparticles formed of conductive materials which are covered with organic materials. Accordingly, since manufacturing process can be simplified and use efficiency of the material can be improved, the memory element can be manufactured with high yield at low cost.

Regarding the semiconductor device including such a memory element, data can be written to the semiconductor device not only once but can also be written additionally. Since data once written to a memory element cannot be erased, it is possible to prevent forgery by rewriting. Therefore, a semiconductor device with excellent performance and reliability can be manufactured at low cost.

Note that this embodiment mode can be combined with any of the other embodiment modes and embodiments as appropriate. For example, in a memory element included in the semiconductor device shown in this embodiment mode, for example, an insulating layer or a semiconductor layer may be provided between the first conductive layer and the memory layer.

This application is based on Japanese Patent Application serial no. 2007-078348 filed with Japan Patent Office on Mar. 26, 2007, the entire contents of which are hereby incorporated by reference.

What is claimed is:

1. A method for manufacturing a memory element, comprising the steps of:
    forming a first conductive layer;
    forming a composition layer over the first conductive layer by discharging a composition in which nanoparticles comprising a conductive material covered with an organic material are dispersed in a solvent;
    drying the composition layer; and
    decomposing the organic material covering the nanoparticles which are positioned on the surface of the composition layer such that a memory layer comprising the nanoparticles covered with the organic material and a second layer comprising the nanoparticles not covered with the organic material are formed in the composition layer, wherein the memory layer is closer to the first conductive layer than the second layer;
    forming a second conductive layer by sintering of the nanoparticles not covered with the organic material in the second layer.

2. The method for manufacturing a memory element according to claim 1,
    wherein reduction treatment is performed after the decomposing step.

3. The method for manufacturing a memory element according to claim 1,
    wherein a grain diameter of each of the nanoparticles is greater than or equal to 1 nm and less than or equal to 200 nm.

4. The method for manufacturing a memory element according to claim 1,
    wherein the organic material comprises a surfactant or a substance which can form a coordinate bond with the conductive material.

5. A method for manufacturing a memory element, comprising the steps of:
    forming a first conductive layer;
    forming a composition layer over the first conductive layer by discharging a composition in which nanoparticles comprising a conductive material covered with an organic material are dispersed in a solvent;
    drying the composition to vaporize the solvent;
    exposing a surface of the composition layer to active oxygen; and
    baking the composition layer so that the surface of the composition layer is made to be a second conductive layer by sintering the nanoparticles exposed to the active oxygen and a memory layer is formed between the first conductive layer and the second conductive layer,
    wherein the memory layer includes nanoparticles covered with the organic material.

6. The method for manufacturing the memory element according to claim 5,
    wherein the active oxygen is generated by irradiating ozone with an ultraviolet ray.

7. The method for manufacturing a memory element according to claim 5,
    wherein reduction treatment is performed after the exposing step.

8. The method for manufacturing a memory element according to claim 5,
    wherein a grain diameter of each of the nanoparticles is greater than or equal to 1 nm and less than or equal to 200 nm.

9. The method for manufacturing a memory element according to claim 5,
    wherein the organic material comprises a surfactant or a substance which can form a coordinate bond with the conductive material.

10. The method for manufacturing the memory element according to claim 6,
    wherein the composition layer is also irradiated with the ultraviolet ray.

11. The method for manufacturing the memory element according to claim 6,
    wherein the ozone is generated by irradiating oxygen with the ultraviolet ray with a wavelength of less than or equal to 240 nm.

12. The method for manufacturing the memory element according to claim 6,
    wherein portions of the ozone and the active oxygen are generated by irradiating oxygen with the ultraviolet ray with a wavelength of less than or equal to 175 nm.

13. The method for manufacturing a memory element according to claim 6,
    wherein irradiation with the ultraviolet ray is performed using a low-pressure mercury vapor lamp.

14. The method for manufacturing a memory element according to claim 6,
    wherein irradiation with the ultraviolet ray is performed using an excimer lamp.

15. A method for manufacturing a memory element, comprising the steps of:
    forming a first conductive layer;
    forming a composition layer over the first conductive layer by discharging a composition in which nanoparticles comprising a conductive material covered with an organic material are dispersed in a solvent;
    drying the composition layer to vaporize the solvent;
    irradiating the composition layer with an ultraviolet ray in an ozone atmosphere; and
    baking the composition layer so that a portion of the composition layer which is irradiated with the ultraviolet ray is made to be a second conductive layer by sintering the nanoparticles and a memory layer is formed between the first conductive layer and the second conductive layer,
    wherein the memory layer includes nanoparticles covered with the organic material.

16. The method for manufacturing a memory element according to claim 15,
    wherein irradiation with the ultraviolet ray is performed using a low-pressure mercury vapor lamp.

17. The method for manufacturing a memory element according to claim 15,
    wherein irradiation with the ultraviolet ray is performed using an excimer lamp.

18. The method for manufacturing a memory element according to claim 15,
    wherein reduction treatment is performed after the irradiating step.

19. The method for manufacturing a memory element according to claim 15,
    wherein a grain diameter of each of the nanoparticles is greater than or equal to 1 nm and less than or equal to 200 nm.

20. The method for manufacturing a memory element according to claim 15, wherein the organic material comprises a surfactant or a substance which can form a coordinate bond with the conductive material.

21. A method for manufacturing a memory element, comprising the steps of:
forming a first conductive layer;
forming a composition layer over the first conductive layer by discharging a composition in which nanoparticles comprising a conductive material covered with an organic material are dispersed in a solvent;
drying the composition layer to vaporize the solvent;
irradiating the composition layer with an ultraviolet ray with a wavelength of less than or equal to 240 nm in the air; and
baking the composition layer so that a portion of the composition layer which is irradiated with the ultraviolet ray is made to be a second conductive layer by sintering the nanoparticles and a memory layer is formed between the first conductive layer and the second conductive layer,
wherein the memory layer includes the nanoparticles covered with the organic materials which are included in the composition.

22. The method for manufacturing a memory element according to claim 21,
wherein irradiation with the ultraviolet ray is performed using a low-pressure mercury vapor lamp.

23. The method for manufacturing a memory element according to claim 21,
wherein irradiation with the ultraviolet ray is performed using an excimer lamp.

24. The method for manufacturing a memory element according to claim 21,
wherein reduction treatment is performed after the irradiating step.

25. The method for manufacturing a memory element according to claim 21,
wherein a grain diameter of each of the nanoparticles is greater than or equal to 1 nm and less than or equal to 200 nm.

26. The method for manufacturing a memory element according to claim 21,
wherein the organic material comprises a surfactant or a substance which can form a coordinate bond with the conductive material.

27. A method for manufacturing a memory element, comprising the steps of:
forming a first conductive layer;
forming a composition layer over the first conductive layer by discharging a composition in which nanoparticles comprising a conductive material covered with an organic material are dispersed in a solvent;
drying the composition layer to vaporize the solvent;
irradiating the composition layer with an ultraviolet ray with a wavelength of less than or equal to 175 nm in the air; and
baking the composition layer so that a portion of the composition layer which is irradiated with the ultraviolet ray is made to be a second conductive layer by sintering the nanoparticles and a memory layer is formed between the first conductive layer and the second conductive layer,
wherein the memory layer includes nanoparticles covered with organic materials which are included in the composition.

28. The method for manufacturing a memory element according to claim 27,
wherein irradiation with the ultraviolet ray is performed using an excimer lamp.

29. The method for manufacturing a memory element according to claim 27,
wherein reduction treatment is performed after the irradiating step.

30. The method for manufacturing a memory element according to claim 27,
wherein a grain diameter of each of the nanoparticles is greater than or equal to 1 nm and less than or equal to 200 nm.

31. The method for manufacturing a memory element according to claim 27,
wherein the organic material comprises a surfactant or a substance which can form a coordinate bond with the conductive material.

* * * * *